United States Patent
Lee et al.

(10) Patent No.: US 9,659,997 B2
(45) Date of Patent: *May 23, 2017

(54) REPLACEMENT MATERIALS PROCESSES FOR FORMING CROSS POINT MEMORY

(71) Applicant: Micron Technology, Inc., Boise, ID (US)

(72) Inventors: Jong-Won Lee, Boise, ID (US); Gianpaolo Spadini, Los Gatos, CA (US); Stephen W. Russell, Boise, ID (US); Derchang Kau, Cupertino, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/058,810

(22) Filed: Mar. 2, 2016

(65) Prior Publication Data

US 2016/0260776 A1    Sep. 8, 2016

Related U.S. Application Data

(63) Continuation of application No. 14/228,104, filed on Mar. 27, 2014, now Pat. No. 9,306,165.

(51) Int. Cl.
*H01L 27/24* (2006.01)
*H01L 45/00* (2006.01)
*G11C 13/00* (2006.01)

(52) U.S. Cl.
CPC ........ *H01L 27/2463* (2013.01); *G11C 13/004* (2013.01); *G11C 13/0004* (2013.01); *G11C 13/0023* (2013.01); *G11C 13/0069* (2013.01); *G11C 13/0097* (2013.01); *H01L 27/24* (2013.01); *H01L 27/2427* (2013.01); *H01L 45/06* (2013.01); *H01L 45/1233* (2013.01); *H01L 45/1246* (2013.01);
(Continued)

(58) Field of Classification Search
None
See application file for complete search history.

(56) References Cited

U.S. PATENT DOCUMENTS

| 7,420,199 B2 | 9/2008 | Gutsche et al. |
| 7,563,639 B2 | 7/2009 | Shin et al. |

(Continued)

FOREIGN PATENT DOCUMENTS

| KR | 1020060050833 A | 5/2006 |
| KR | 1020110015000 A | 2/2011 |

OTHER PUBLICATIONS

English Translation of Office Action dated May 21, 2015 in ROC (Taiwan) Patent Application No. 102141941.
(Continued)

*Primary Examiner* — Asok K Sarkar
(74) *Attorney, Agent, or Firm* — Holland & Hart LLP

(57) ABSTRACT

Methods of forming memory cells comprising phase change and/or chalcogenide materials are disclosed. In one aspect, the method includes providing a lower line stack extending in a first direction, the lower line stack comprising a sacrificial line over a lower conductive line. The method further includes forming a chalcogenide line extending in the first direction by selectively removing the sacrificial material of the sacrificial line and replacing the sacrificial line with a chalcogenide material.

18 Claims, 34 Drawing Sheets

(52) U.S. Cl.
CPC ........ *H01L 45/1253* (2013.01); *H01L 45/141* (2013.01); *H01L 45/142* (2013.01); *H01L 45/143* (2013.01); *H01L 45/144* (2013.01); *H01L 45/1675* (2013.01); *H01L 45/1683* (2013.01)

(56) References Cited

U.S. PATENT DOCUMENTS

| | | | |
|---|---|---|---|
| 7,671,354 | B2 | 3/2010 | Happ et al. |
| 7,733,685 | B2 | 6/2010 | Scheuerlein et al. |
| 8,093,576 | B1 | 1/2012 | Lee |
| 8,105,867 | B2 | 1/2012 | Matamis et al. |
| 8,237,140 | B2 | 8/2012 | Lung et al. |
| 8,278,206 | B2 | 10/2012 | Oh et al. |
| 8,278,641 | B2 | 10/2012 | Lee et al. |
| 8,367,544 | B2 | 2/2013 | Cheng et al. |
| 8,377,741 | B2 | 2/2013 | Savransky et al. |
| 8,395,935 | B2 | 3/2013 | Lung et al. |
| 8,404,514 | B2 | 3/2013 | Lee et al. |
| 8,426,840 | B2 | 4/2013 | An et al. |
| 8,530,939 | B2 | 9/2013 | Sills et al. |
| 8,546,944 | B2 | 10/2013 | Min |
| 8,551,853 | B2 | 10/2013 | Tsuji et al. |
| 8,581,222 | B2 | 11/2013 | Yoo et al. |
| 8,652,909 | B2 | 2/2014 | Sills et al. |
| 8,765,581 | B2 | 7/2014 | Lee et al. |
| 8,785,213 | B2 | 7/2014 | Oh et al. |
| 8,785,237 | B2 | 7/2014 | Im et al. |
| 8,811,062 | B2 | 8/2014 | Kim |
| 8,883,602 | B2 | 11/2014 | Liu et al. |
| 9,018,692 | B2 | 4/2015 | Lung |
| 9,252,188 | B2 | 2/2016 | Tang et al. |
| 9,306,165 | B2 * | 4/2016 | Lee ........................ H01L 45/141 |
| 2008/0176374 | A1 | 7/2008 | Jon et al. |
| 2008/0280390 | A1 | 11/2008 | Kim et al. |
| 2009/0280599 | A1 | 11/2009 | Im et al. |
| 2011/0018053 | A1 | 1/2011 | Lo et al. |
| 2012/0235211 | A1 * | 9/2012 | Sills .................... H01L 27/2463 257/211 |

OTHER PUBLICATIONS

English Translation of Office Action for corresponding ROC (Taiwan) Patent Application 104109828, Mail Date Mar. 29, 2016, 5 pages.

ISA/EPO, International Preliminary Report on Patentability, Int'l Appl. No. PCT/US2013/069009, May 26, 2015, Korean Intellectual Property Office, Seo-gu, Daejeon Metropolitan City, Republic of Korea, 8 pgs.

ISA/EPO, International Search Report and Written Opinion of the International Searching Authority, Int'l Appl. No. PCT/US2013/069009, Feb. 26, 2014, Korean Intellectual Property Office, Seo-gu, Daejeon Metropolitan City, Republic of Korea, 10 pgs.

ISA/EPO, International Search Report and Written Opinion of the International Searching Authority, Int'l Appl. No. PCT/US2015/022576, Jun. 30, 2015, Korean Intellectual Property Office, Seo-gu, Daejeon Metropolitan City, Republic of Korea, 15 pgs.

Raoux et al., "Phase-change random access memory: A scalable technology," IBM J. Res. & Dev., Jul./Sep. 2008, 15 pgs., vol. 52, No. 4/5, IBM 2008.

* cited by examiner

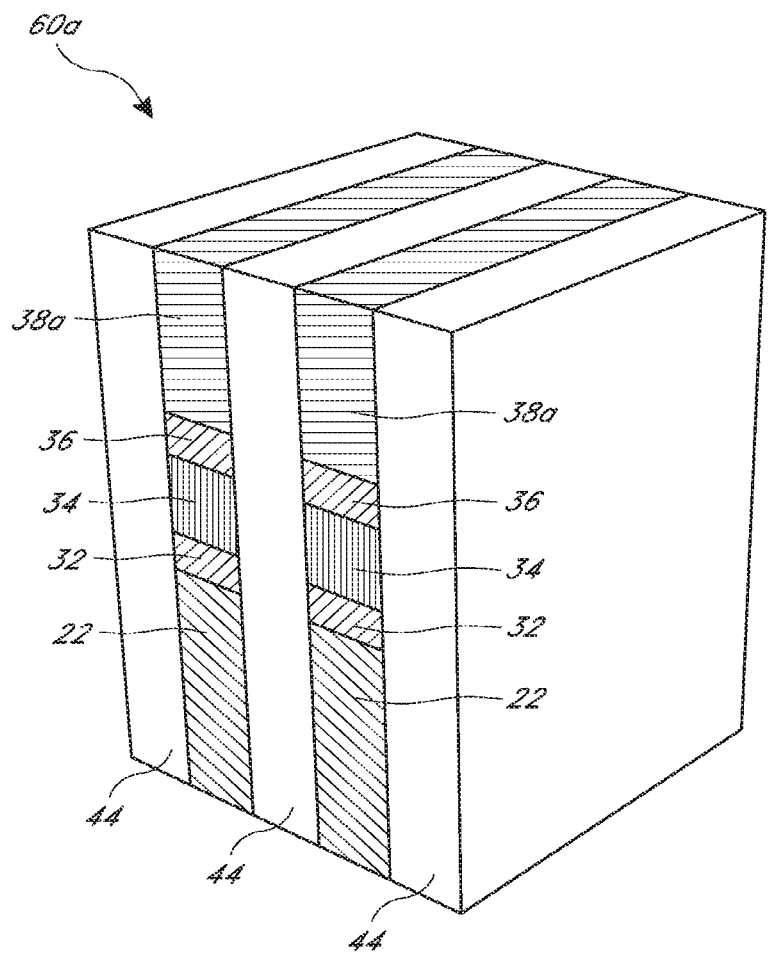
FIG. 3A
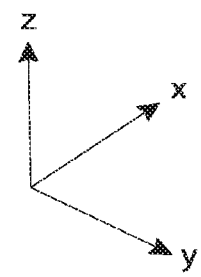

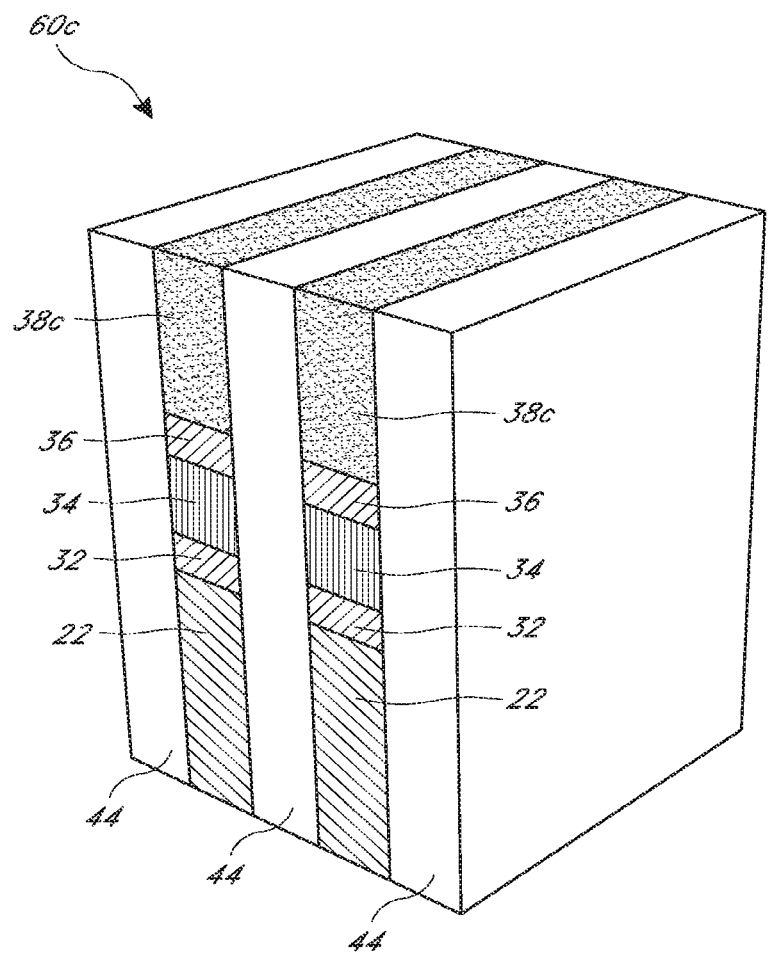
FIG. 3C
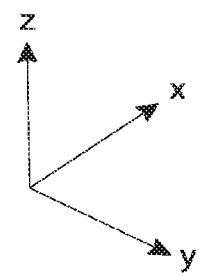

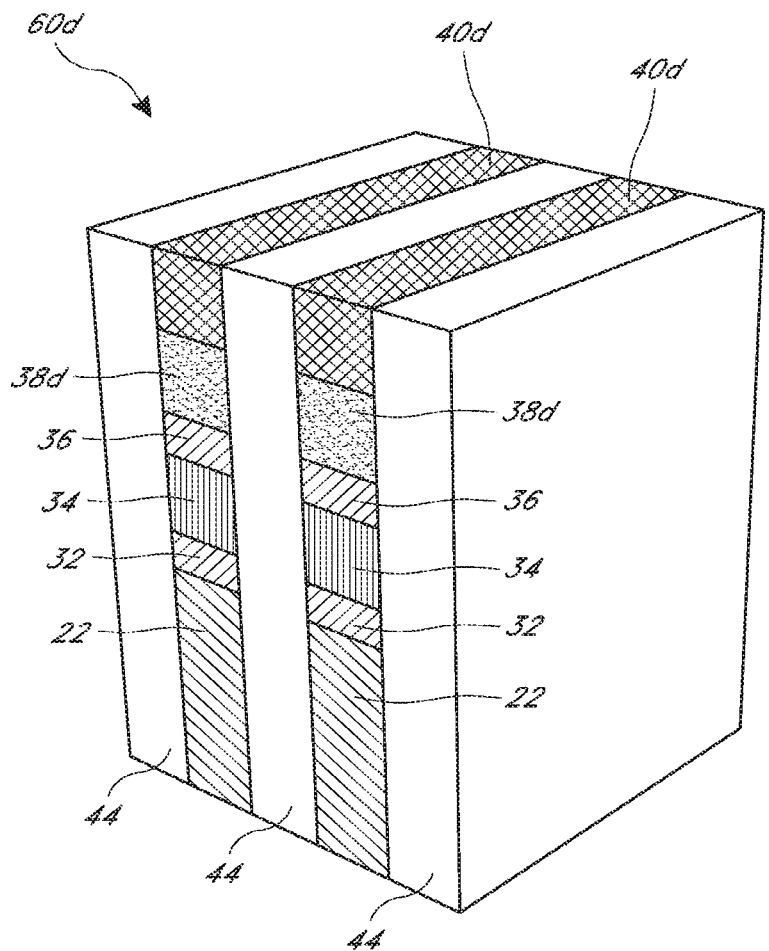
FIG. 3D
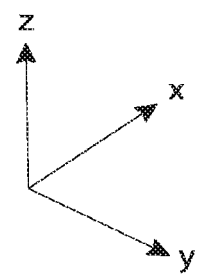

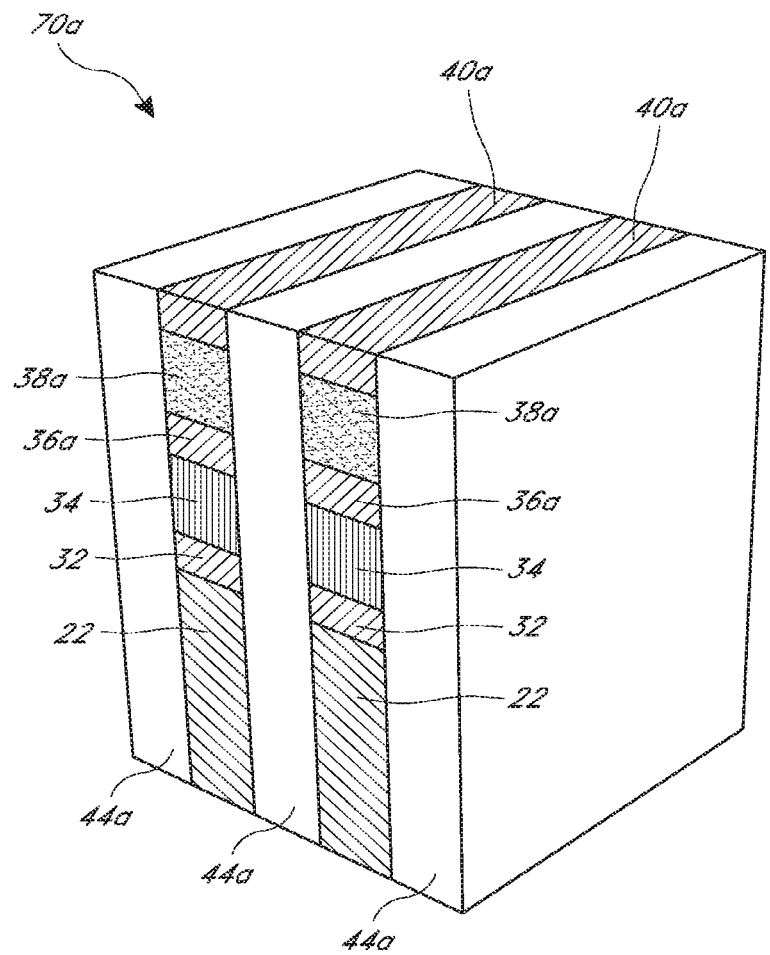
FIG. 4A
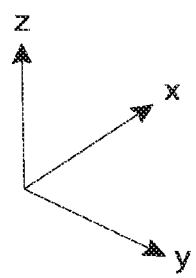

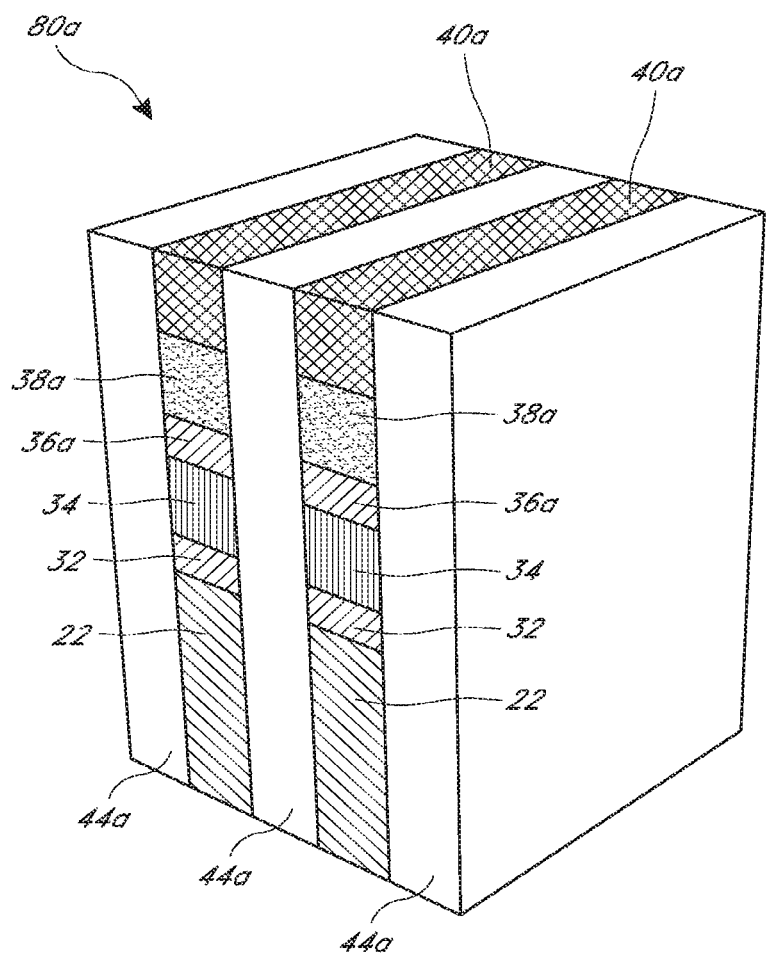
FIG. 5A
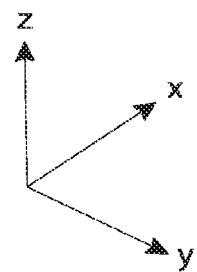

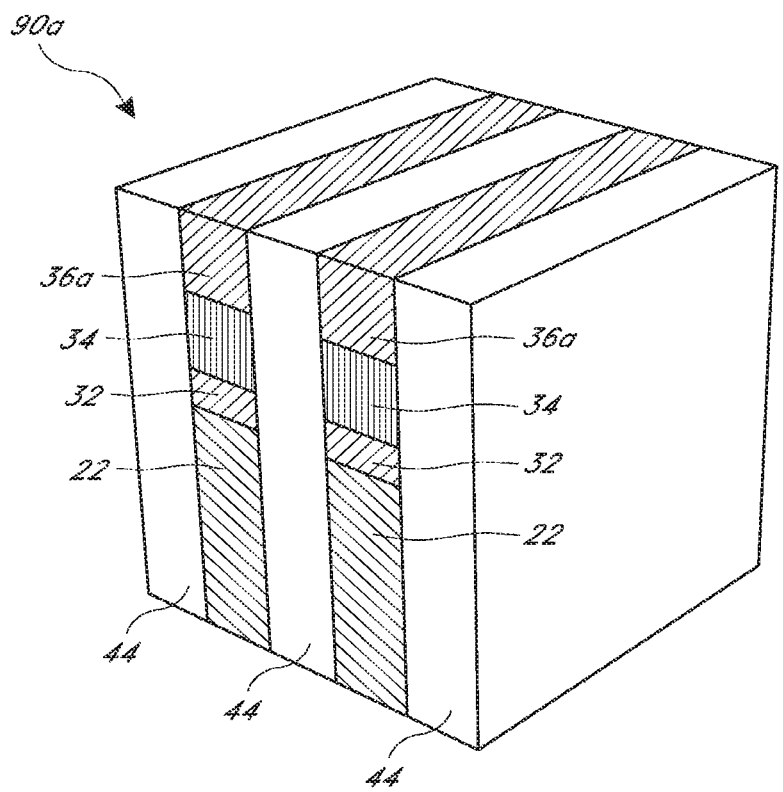
FIG. 6A
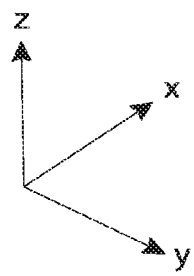

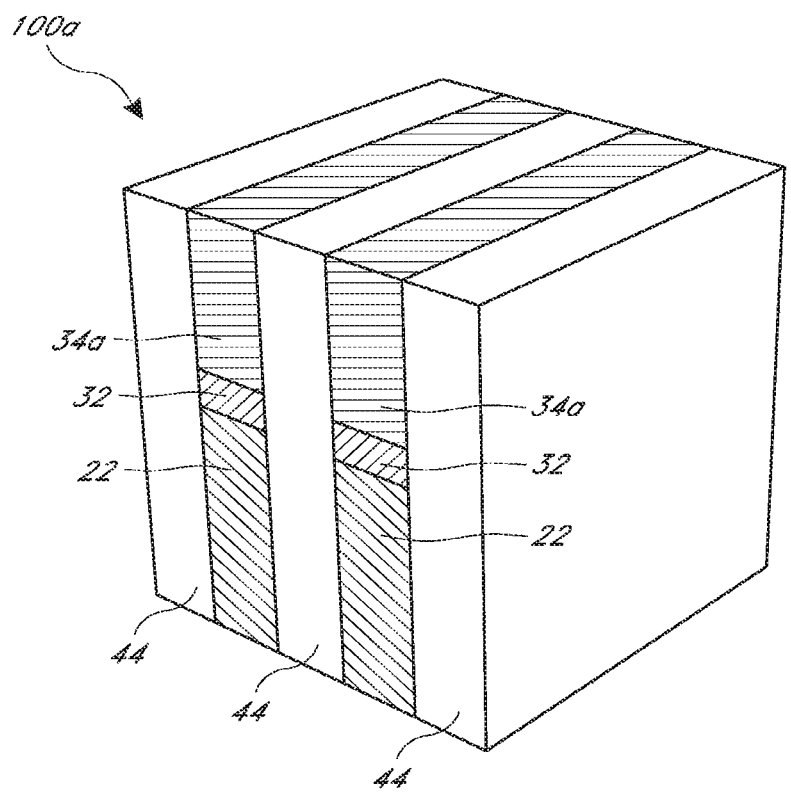
*FIG. 7A*
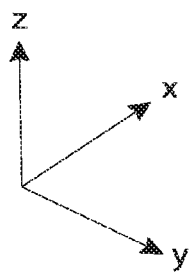

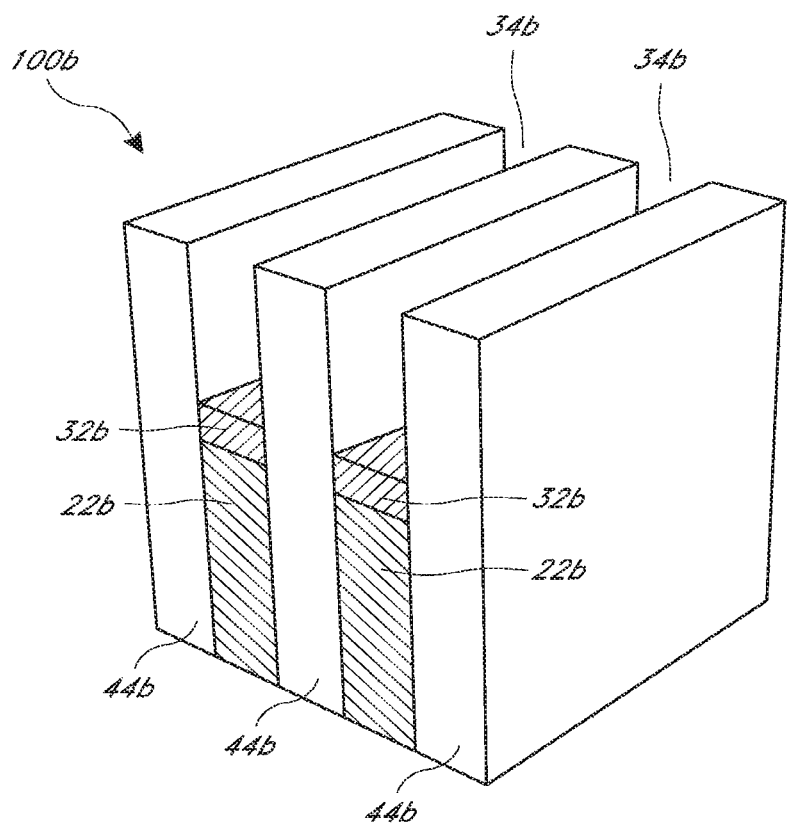
FIG. 7B
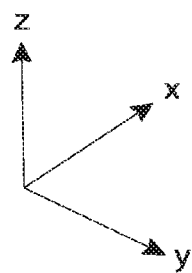

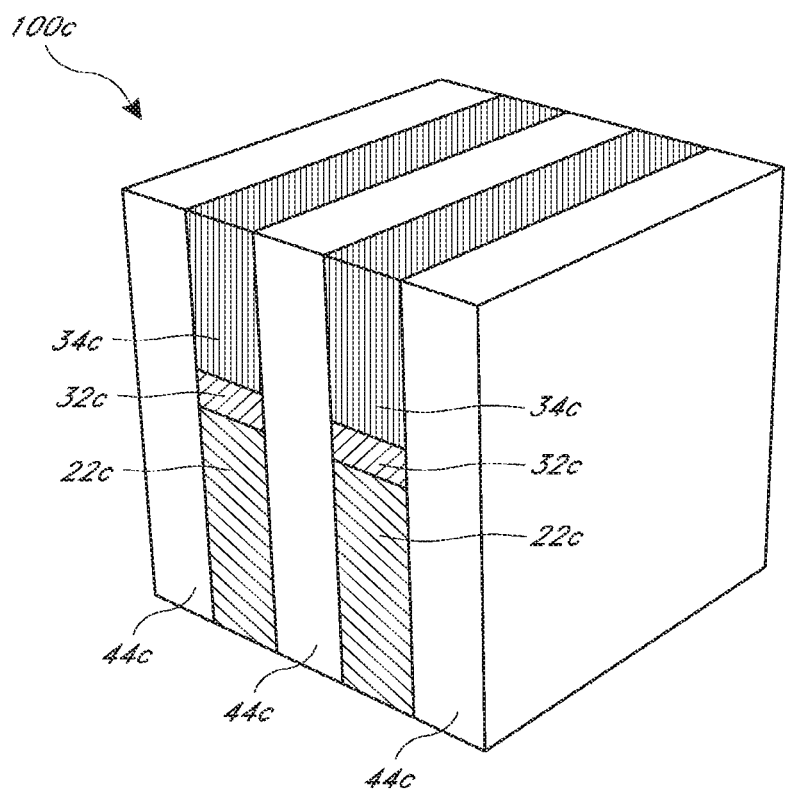
FIG. 7C
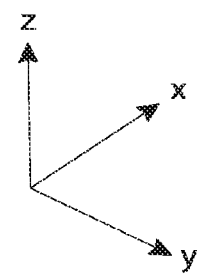

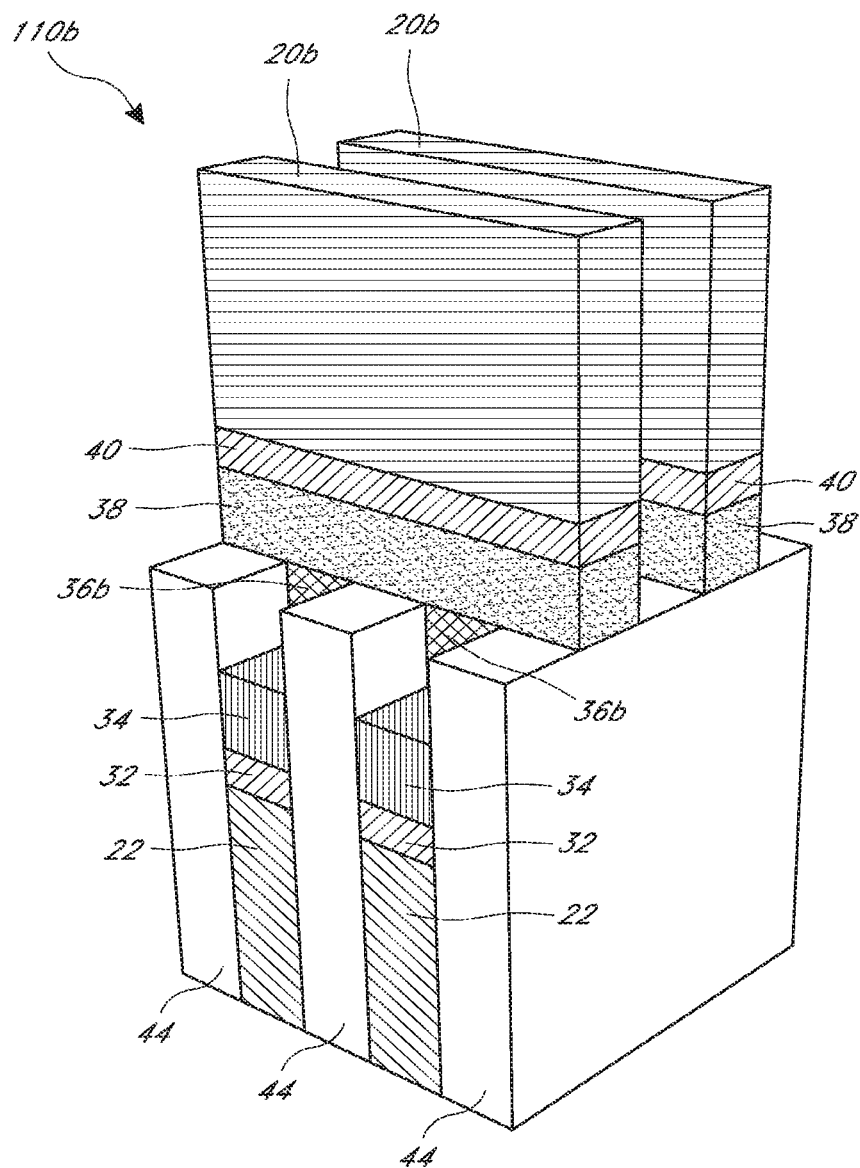
FIG. 8B
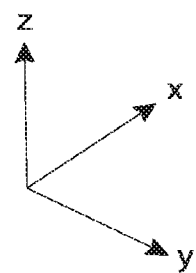

REPLACEMENT MATERIALS PROCESSES FOR FORMING CROSS POINT MEMORY

CROSS REFERENCES

The present application for patent claims priority to U.S. patent application Ser. No. 14/228,104 by Lee et al., entitled "Replacement Materials Processes for Forming Cross Point Memory," filed Mar. 27, 2014, now U.S. Pat. No. 9,306,165, issued Apr. 5, 2016, assigned to the assignee hereof, and expressly incorporated by reference herein.

BACKGROUND

Field

Subject matter disclosed herein relates to devices in integrated circuits generally, and in particular, to methods of forming arrays of devices, such as memory cells within a cross-point array.

Description of the Related Art

Devices incorporating chalcogenide materials, e.g., ovonic threshold switches and phase change storage elements, may be found in a wide range of electronic devices. Such devices may be used in computers, digital cameras, cellular telephones, personal digital assistants, etc. Factors that a system designer may consider in determining whether and how to incorporate chalcogenide materials for a particular application may include, physical size, storage density, scalability, operating voltages and currents, read/write speed, read/write throughput, transmission rate, power consumption, and/or methods of forming devices with the chalcogenide materials, for example.

BRIEF DESCRIPTION OF THE DRAWINGS

Claimed subject matter is particularly pointed out in the concluding portion of the specification. However, organization and/or method of operation, together with certain objects, features, and/or advantages thereof, may be better understood by reference to the following detailed description if read with the accompanying drawings in which:

FIGS. 3A-3E are schematic three-dimensional depictions of various stages of fabrication of a memory cell according to some embodiments.

FIGS. 4A-4E are schematic three-dimensional depictions of various stages of fabrication of a memory cell according to some other embodiments.

FIGS. 5A-5E are schematic three-dimensional depictions of various stages of fabrication of a memory cell according to some other embodiments.

FIGS. 6A-6E are schematic three-dimensional depictions of various stages of fabrication of a memory cell according to some other embodiments.

FIGS. 7A-7E are schematic three-dimensional depictions of various stages of fabrication of a memory cell according to some other embodiments.

FIGS. 8A-8E are schematic three-dimensional depictions of various stages of fabrication of a memory cell according to some other embodiments.

Figure 1A:
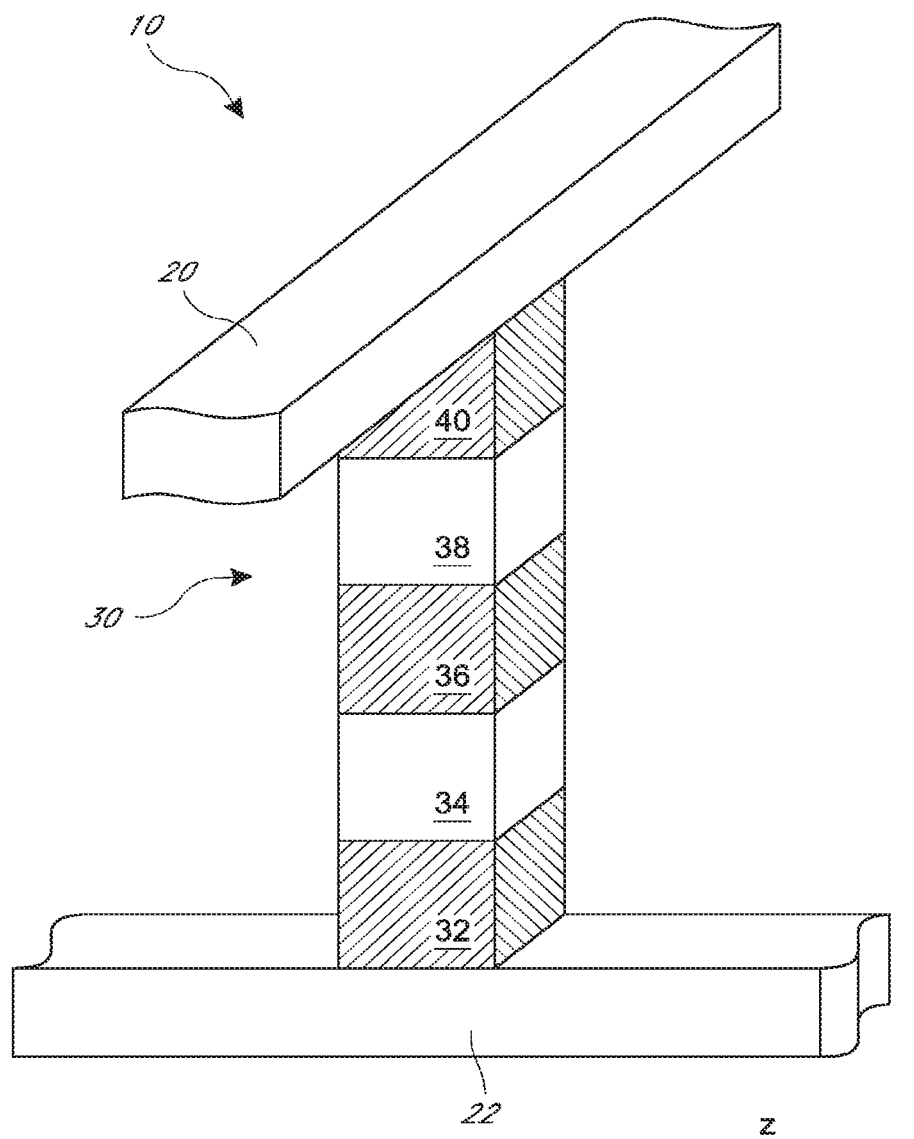
FIG. 1A is a schematic three-dimensional depiction of a memory cell according to some embodiments.

Features in the drawings are not necessarily drawn to scale and may extend in different directions from that illustrated. While various axes and directions are illustrated to facilitate the discussion herein, it will be appreciated that the features may extend in different directions.

DETAILED DESCRIPTION

Devices incorporating materials that change resistance in operation may be found in a wide range of electronic devices, for e.g., computers, digital cameras, cellular telephones, personal digital assistants, etc. Devices incorporating such materials, for example, can be memory devices. Materials that change resistance in turn can take on many different categories based on their material compositions. One such category of materials is chalcogenide materials, which can serve either as a storage node or a selector node of a memory device. As a storage node, for example, certain chalcogenide materials can be phase change materials that store information based on a resistance change originating from a stable (i.e., nonvolatile) change in the phase of the materials in response to heating and/or an applied electric field. In comparison, as a selector node, certain chalcogenide materials can be Ovonic threshold switching materials that temporarily change their resistance in response to an applied electric field, without a nonvolatile change in phases. Phase change memory devices having a chalcogenide-based storage node, a chalcogenide-based selector node, or chalcogenide-based storage and selector nodes can provide several performance advantages over other memory devices, such as flash memory devices and dynamic random access memory devices (DRAM). For example, some phase change memory devices can be nonvolatile, such that physical and electrical states of the memory devices do not change substantially over a retention time (e.g., longer than one year) without any external power supplied thereto. In addition, some phase change memory devices can provide fast read and write access times (e.g., faster than 10 nanoseconds) and/or high read and write access bandwidth (e.g., greater than 100 megabits per second). In addition, some phase change memory device can be arranged in a very high density memory array, e.g., a cross-point array having greater than 1 million cells in the smallest memory array unit connected with local metallization.

In fabricating high density memory arrays with small (e.g., sub-100 nm) minimum feature size (e.g., half-pitch of columns or rows), one consideration in choosing a fabrication process flow is the mechanical stability of intermediate structures (e.g., row or column lines) during processing. Inadequate mechanical stability can lead to problems such as warping and/or collapsing of the features due to the environment to which the features are exposed, such as during subsequent processing. Such environments can include, for example, a plasma environment in which features can be electrostatically charged, or an aqueous environment in which features can experience capillary forces. One approach of remedying inadequate mechanical stability of certain features is designing the fabrication process flow to employ temporary sacrificial materials having sufficient mechanical stability through processes that cause harsh processing environment, and replacing the sacrificial materials with permanent functional materials (that is, materials that form the final device) later in the process flow.

In the following, methods of forming intermediate structures by employing replacement processes using sacrificial materials and replacing the sacrificial materials with permanent functional materials are disclosed. In some embodiments, the sacrificial materials may be patterned to form sacrificial structures, other materials may be formed around those sacrificial structures, and the sacrificial materials may be replaced by permanent materials. In particular, the permanent functional materials can be phase change materials, for example chalcogenide materials, for the selector node and/or storage node, or conductive materials that are electrically connected to the phase change materials, e.g., metal line materials and electrode materials.

In some embodiments, methods of forming a chalcogenide line by a replacement process include providing a material stack including a conductive material and a sacrificial material over the conductive material. The sacrificial material and the conductive material are then lithographically patterned and etched to form alternating line stacks and spaces, where each of the line stacks may include a sacrificial line over a conductive line. The spaces are then filled with a dielectric material such as an isolation dielectric. Subsequently, the sacrificial material is selectively removed by a suitable etch technique to form gaps interposed between the adjacent spaces filled with the dielectric material. The gaps are then filled with a chalcogenide material to form chalcogenide lines.

In some other embodiments, methods of forming a conductive line by a replacement process include providing a first line stack extending in a first direction that includes a chalcogenide line over a first conductive line. The methods also include providing a sacrificial material over the first line stack and etching the sacrificial material to form a second line stack disposed between adjacent spaces. The resulting second line stack includes a sacrificial line extending in a second direction crossing the first direction. Subsequently, the adjacent spaces are filled with a dielectric material. The sacrificial material is then selectively removed to form a gap interposed between the adjacent spaces filled with the dielectric material. The gaps are then filled with a conductive material to form a second conductive line.

It will be understood that while embodiments of memory cells described herein include both storage nodes and selector nodes comprising chalcogenide materials, other embodiments are possible. In some embodiments, a memory cell can include a storage node including a chalcogenide phase change material, while including a selector node that does not include a chalcogenide material, such as a bipolar junction transistor or a diode. In some other embodiments, another material with similar electrical behavior as the chalcogenide phase change material may be used in place of that chalcogenide phase change material. In some other embodiments, a memory cell can include a selector node including an Ovonic threshold switching material, while including a storage node that does not include a chalcogenide material, such an oxide-based resistance change oxide material. In yet other embodiments, a memory cell can include a chalcogenide phase change material having both storage and selector functionalities and not include a separate selector node.

Figure 1B:
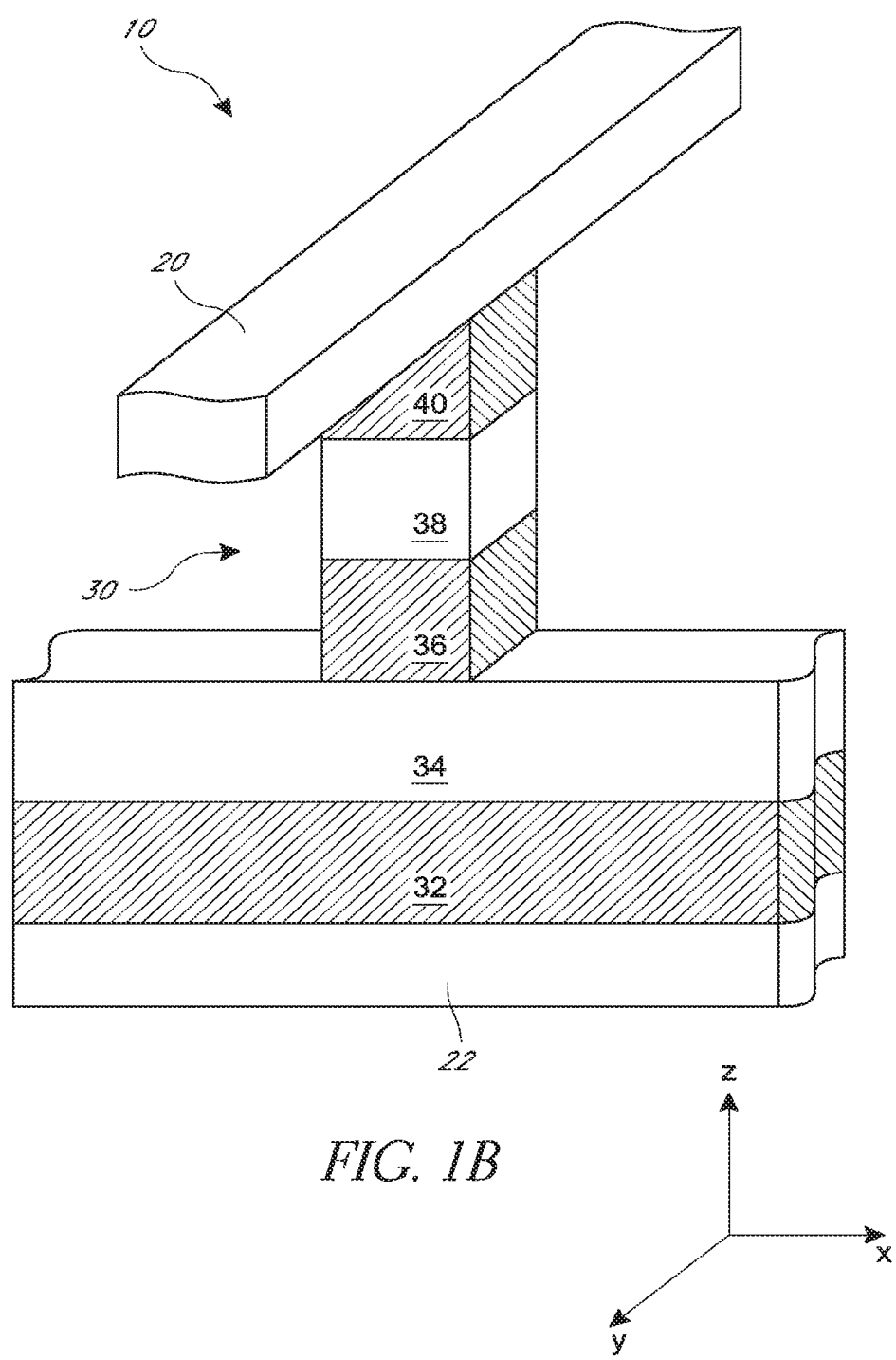
FIG. 1B is a schematic three-dimensional depiction of a memory cell according to some other embodiments.
Figure 1C:
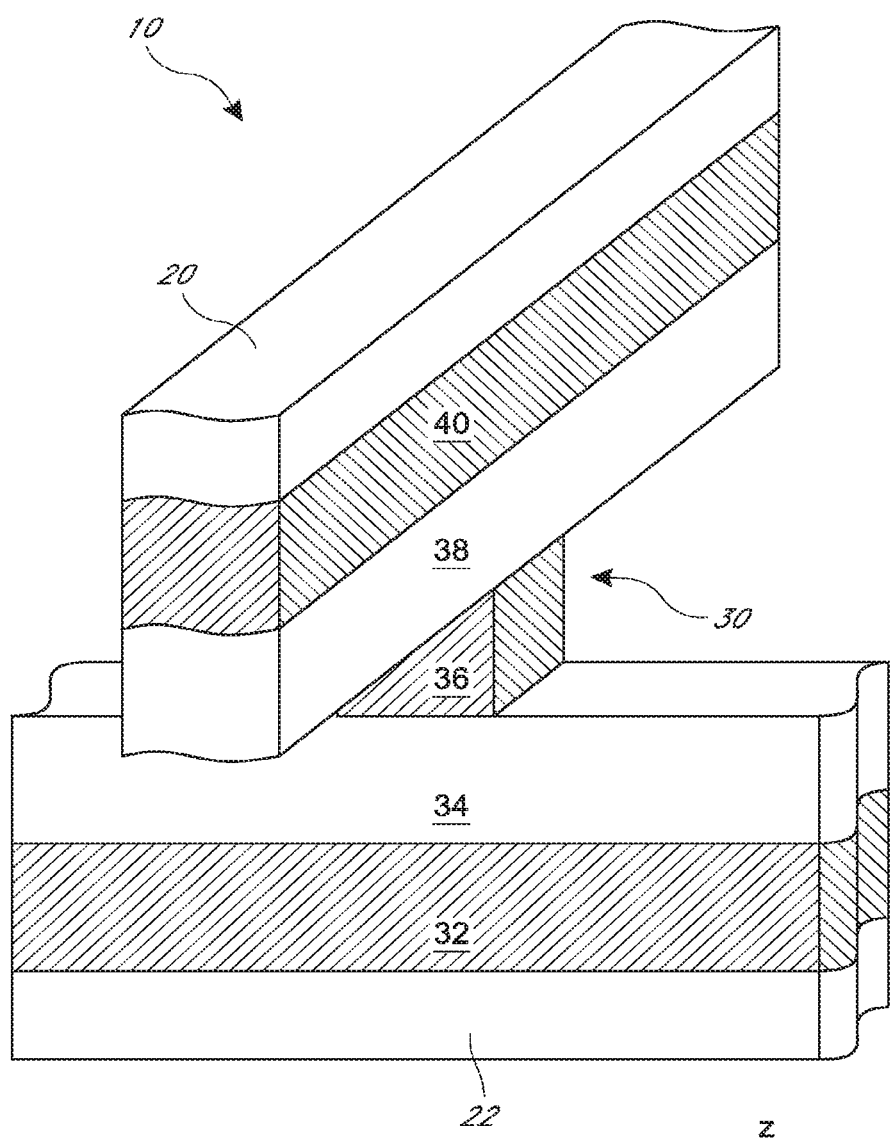
FIG. 1C is a schematic three-dimensional depiction of a memory cell according to some other embodiments.

FIGS. 1A-1C each depict an interconnected memory cell 10 in a cross-point memory array according to some embodiments. The interconnected memory cells 10 in FIGS. 1A-1C are formed by phase change memory cell stacks 30 arranged in a stack configuration between a column line 20 extending generally in a y-direction and a row line 22 extending generally in an x-direction. The phase change memory cell stack 30 includes a first electrode 32 in electrical communication with the row line 22, a selector node 34 on the first electrode 32, a middle electrode 36 on the selector node 34, a storage node 38 in on the middle electrode 36, and a second electrode 40 on the storage node 38 and in electrical communication with the column line 20. The phase change memory cell stack 30 can be surrounded by isolation dielectric materials (not shown). Other embodiments of the stack configuration are possible. For example, the positions of the storage node 38 and the selector node 34 may be interchanged with one another. In other examples, any one of the first, second, and middle electrodes may be interchanged with one another. In yet other examples, any one of the first electrode 32, the middle electrode 36, the second electrode 40, and the selector node 34 may be omitted. Additionally, the "row" and "column" designations are interchangeable, and the rows and columns are generally perpendicular but may intersect at other than 90°, as seen in a top-down view.

In some embodiments, one or both of the storage node 38 and the selector node 34 can comprise chalcogenide materials. When both the storage node 38 and the selector node 34 comprise chalcogenide materials, the storage node 38 can comprise a chalcogenide material that can undergo a phase change that is nonvolatile at ambient (e.g., room) temperature. On the other hand, the selector node 34 can comprise a chalcogenide material that does not undergo a similar stable phase change.

In some embodiments, the storage node 38 includes a phase change material that includes chalcogenide compositions such as an alloy including at least two of the elements within the indium(In)-antimony(Sb)-tellurium(Te) (IST) alloy system, e.g., $In_2Sb_2Te_5$, $InSb_2Te_4$, $InSb_4Te_7$, etc., an alloy including at least two of the elements within the germanium(Ge)-antimony(Sb)-tellurium(Te) (GST) alloy system, e.g., $Ge_8Sb_5Te_8$, $Ge_2Sb_2Te_5$, $GeiSb_2Te_4$, $GeiSb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage nodes include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

When included in the memory cell 10, the selector node 34 may be a two-terminal selector electrically coupled to the storage node 38 through the middle electrode 36 on one side and electrically connected to the row line 22 through the first electrode 32 on the other side. In some embodiments, the selector node 34 comprises a chalcogenide material and can be referred to as an Ovonic Threshold Switch (OTS). An OTS may include a chalcogenide composition including any one of the chalcogenide alloy systems described above for the storage node. In addition, the selector node may further comprise an element to suppress crystallization, such as arsenic (As). When added, an element such as As suppresses crystallization by inhibiting any non-transitory nucleation and/or growth of the alloy. Accordingly, the selector node 34 may be configured to switch to a conductive state when a potential exceeding a threshold voltage is applied across the selector node 34. In addition, the conductive state can be maintained while a sufficient holding current is maintained across the selector node. Examples of OTS materials include Te—As—Ge—Si, Ge—Te—Pb, Ge—Se—Te, Al—As—

Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Various features within phase change memory cell stack 30 arranged in a stack configuration can be isolated by at least one dielectric material at the side of the stack 30 and extending in the x-direction and/or the y-direction. By isolating a feature within the dielectric, the feature's electrical isolation and/or thermal isolation may be improved. Improving a feature's electrical and/or isolation and/or thermal isolation in one or more directions can result in a performance advantage of the phase change memory cells with respect to some device parameters. In one example, by thermally isolating the storage node 38 in both x and y-directions within an isolation dielectric having a lower thermal conductivity than that of the chalcogenide material of the storage node, the thermal confinement of the storage node 38 can be enhanced, leading to lowering of the energy consumed during an access operation and/or shortening of the time duration of the access operation. On the other hand, the thermal confinement of the storage node 38 can be enhanced by thermally isolating the storage node 38 in only one direction when the thermal conductivity of the chalcogenide material of the storage node is lower compared to that of the isolation dielectric. In another example, thermally isolating the storage node 38 in both directions can increase processing complexity compared to thermally isolating the storage node 38 in only one direction. Thus, particular implementations of the memory cell stack 30 can differ with respect to isolation schemes of the features within the memory cell stack 30.

In the illustrated embodiment of FIG. 1A, each feature within the memory cell stack 30 of the first electrode 32, the selector node 34, the middle electrode 36, the storage node 38, and the second electrode 40 are isolated in both the x direction and the y direction. Under this configuration, each feature within the memory cell stack 30 is surrounded in both x and y-directions by isolation dielectric.

In the illustrated embodiment of FIG. 1B, the first electrode 32 and the selector node 34 form a line extending in the x-direction and are isolated in the y-direction. In addition, the remaining features within the memory cell stack 30, namely the middle electrode 36, the storage node 38, and the second electrode 40 are isolated in both the x direction and the y direction. Under this configuration, the first electrode 32 and the selector node 34 are isolated on both sides of the line in the y-direction by isolation dielectrics extending adjacent to the first electrode 32 and the selector node 34 and extending in the x-direction. In addition, the remaining features within the memory cell stack 30, namely the middle electrode 36, the storage node 38, and the second electrode 40, are isolated in both the x direction and the y direction.

In the illustrated embodiment of FIG. 1C, the first electrode 32 and the selector node 34 form a line extending in the x-direction and are isolated in the y-direction. In addition, the second electrode 40 and the storage node 38 form a line extending in the y-direction and are isolated in the x-direction. In addition, the middle electrode 36 is isolated in both the x direction and the y direction. Under this configuration, the first electrode 32 and the selector node 34 are isolated on both sides of the line in the y-direction by isolation dielectrics extending adjacent to the first electrode 32 and the selector node 34 and extending in the x-direction. In addition, the second electrode 40 and the storage node 38 are isolated on both sides of the line in the x-direction by isolation dielectrics extending adjacent to the second electrode 40 and the storage node 34 and extending in the y-direction. In addition, the middle electrode 36 is isolated in both the x direction and the y direction.

Figure 2:
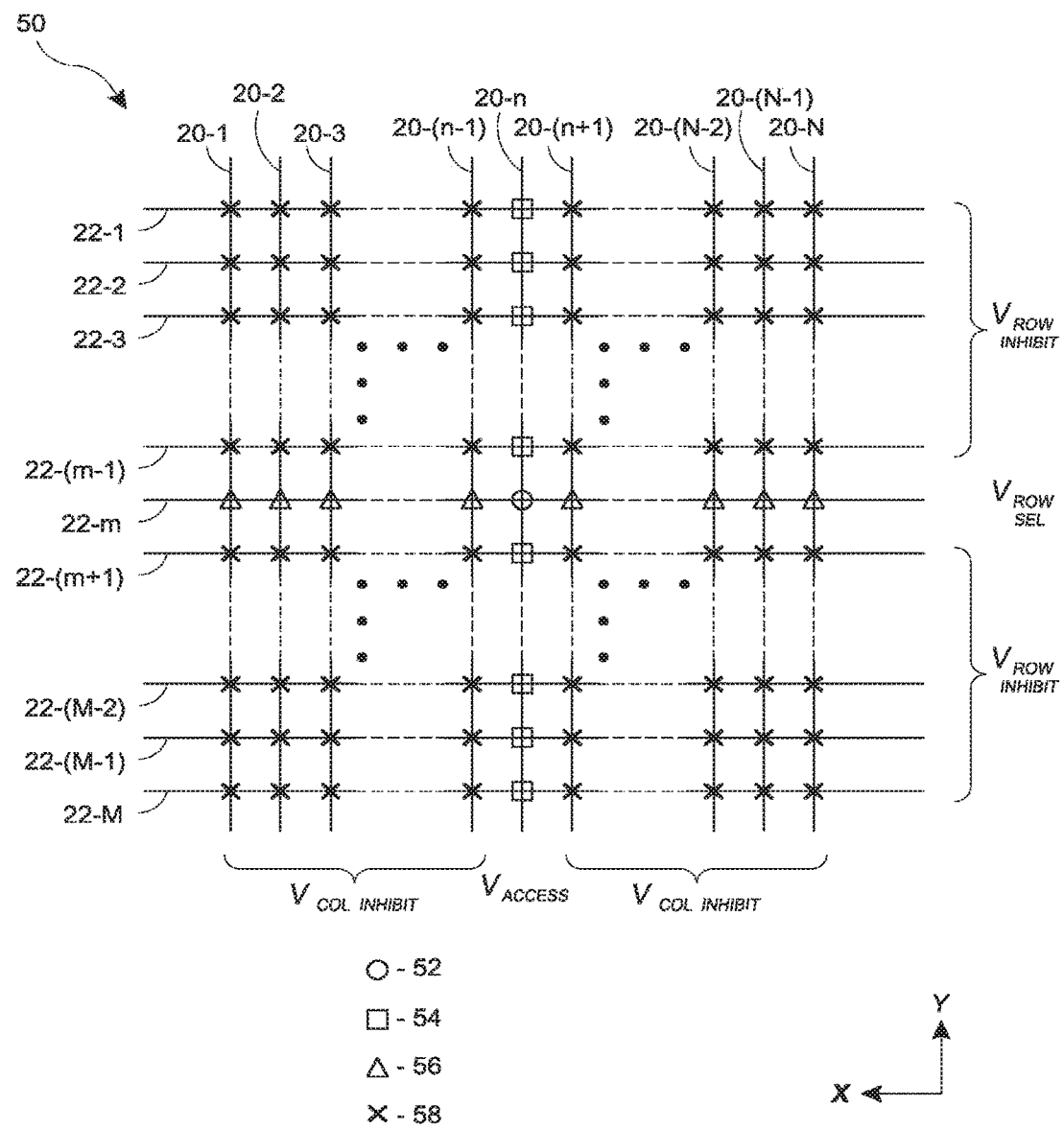
FIG. 2 is a schematic plan-view illustration depicting a cross-point memory array according some embodiments.

FIG. 2 illustrates a cross-point memory array 50 comprising N×M memory cells at intersections of N columns 20 extending in a y direction and M rows 22 extending in an x-direction according to one embodiment. N columns 20 including first through Nth columns 20-1, 20-2, . . . , and 20-N can be access lines, e.g., digit or bit lines, and M rows 22 including first through Mth rows 22-1, 22-2, . . . , and 22-M can be access lines, e.g., word lines that cross with the columns 22. The memory cells can be phase change memory cells disposed at least a subset of the intersections formed by columns 20 and rows 22.

In one embodiment, any one of the memory cells disposed at an intersection formed by any one of columns 20 and rows 22 may have a resistance state that may be a relatively high resistance state (HRS), also known as the RESET state, which can correspond to a phase change material including a substantial amorphous region. Similarly, any one of the memory cells may have a resistance state that may be a relatively low resistance state (LRS), also known as the SET state, which can correspond to a phase change material that is substantially crystalline. The FIRS and LRS can have a resistance ratio between, for example, about two and about 1 million. Under this implementation, low and high resistance states may correspond to the "1" state and a "0" state, respectively, in a single bit-per-cell memory system. However, the opposite correspondence may also be used; the states "1" and "0" may correspond to high and low resistance states, respectively, in some embodiments.

In some embodiments, each one of the memory cells disposed at an intersection formed by any one of columns 20 and any one of rows 22 may be accessed by an access operation. As used herein, an access operation may refer to, for example, a write access operation, an erase access operation, or a read access operation. A write access operation, which for a phase change memory can also be referred to as a program operation or a RESET operation, changes the resistance state of the memory cell from a relatively low resistance state to a relatively high resistance state. Similarly, an erase operation, which for a phase change memory can also be referred to as a SET operation, changes the resistance state of the memory cell from a relatively high resistance state to a relatively low resistance state. However, the terms "write" and "erase" as they relate to RESET and SET operations may be used to mean the opposite from that noted above in some embodiments. For example, an erase operation may be referred to as a SET operation, and a program or write operation may be referred to as a RESET operation.

In the illustrated embodiment of FIG. 2, each one of the memory cells disposed at an intersection formed by any of the columns and rows may be biased individually in a bit-addressable access mode. As used herein, a bias applied to a memory cell refers to a voltage difference applied across the memory cell. In a bit-addressable bias mode, a memory cell to be accessed may be referred to as a target cell 52 located at an intersection formed by an nth column 20-n and an mth row 22-m. An access bias may be a voltage-controlled bias VACCESS, which may be a SET access bias VsET, a RESET access bias VRESET, or a read access bias VREAD, which may be applied across the target cell of this example by applying the access voltages across the nth column 20-n and the mth row 22-m. In other examples, an access bias may be a current-controlled bias I ACCESS, which may be a SET access current Ism', a RESET access current 'RESET, or a read access current TREAD.

In one embodiment, the target cell 52 can be accessed while inhibiting (i.e., preventing) the remaining cells from getting accessed. This can be achieved, for example, by applying bias of VACCESS across the target cell 52 while applying biases substantially lower than VACCESS across the rest of the cells. For example, VCOL SEL can be applied to a selected column (20-n in this example) while applying VROW SEL to a selected row (22-m in this example). Concurrently, a bias VCOL INHIBIT is applied across all remaining columns and a bias VROW INHIBIT is applied across all remaining rows. Under this configuration, when the bias between VCOL SEL and VROW SEL exceeds VACCESS, the target cell 52 can be accessed. In addition, a bias in magnitude of about (VCOL SEL-VROW INHIBIT) is dropped across inhibited cells 54 along the selected column 20-n. In addition, a bias in magnitude of about (VROW SEL-VCOL INHIBIT) is dropped across inhibited cells 56 along the selected row 22-m. In addition, a bias in magnitude of about (VCOL INHIBIT-VROW INHIBIT) is dropped across all remaining inhibited cells 58 across inhibited rows and inhibited columns.

With reference again to FIGS. 1A-1C, by choosing a particular process flow, electrical isolation and/or thermal isolation of various features may be improved. Also as described, thermally isolating certain features in one or two directions can increase or decrease processing complexity depending on a particular process flow. Another consideration in choosing a process flow is mechanical stability of intermediate structures during processing. For example, as minimum feature size (e.g., the half pitch of columns and rows) continue to shrink, patterning various features to be isolated in one or two directions can lead to inadequate mechanical stability. Inadequate mechanical stability can lead to problems such as warping and collapsing of the features due to the environment to which the features are exposed and/or subsequent processing. Such environments can include, for example, a plasma environment in which features can be electrostatically charged, or an aqueous environment in which features can experience capillary forces. In this connection, it may be desirable to choose a process flow where a processing complexity of patterning a structure can be largely decoupled from materials of the structure that cause the processing complexity. For example, features including a chalcogenide material may not have sufficient mechanical strength to withstand a dielectric gap-filling process after being subtractively patterned due to various forces, examples of which have been described above.

As used herein, a "subtractive patterning process" refers to a process where structures to be defined, which can include a storage node, a selector node, an electrode, a conductive line, a sacrificial structure, or a combination of such structures, are formed by removing materials to define that structure. For example, the features to be formed are patterned by first lithographically providing etch mask structures (e.g., photoresist pattern or a hard mask pattern) overlapping areas to be patterned. The lithography process is followed by an etch removal process, where materials in areas masked by the mask structures are protected while materials in exposed areas are removed by the etch removal process.

In some embodiments, the etch removal process can then be followed by a gap-filling process to fill spaces formed between the etched structures with insulating materials such as an oxide. Where a subtractive process is used to define a sacrificial structure, the sacrificial structure can be replaced by a replacement material process, where the sacrificial material of the sacrificial structure is selectively removed and replaced by a permanent material such as a chalcogenide material or a conductive material. As used herein, a permanent material is a material that forms a structure in the final device.

Using subtractive patterning followed by a replacement material process, a sacrificial structure having high mechanical strength can be used as a "placeholder" throughout processes that require such high mechanical strength, e.g., etch, clean, and gapfill processes, and subsequently be replaced with a suitable functional material such as a chalcogenide material that would not otherwise have been able to withstand such processes without substantial degradation. In one aspect, subtractive patterning process followed by a replacement material process can be contrasted with a damascene process, where gaps are first created in blanket dielectric layers by lithography and etch processes, followed by filling the gaps with materials to form the final structures.

By way of an example, while aluminum or copper with high conductivity can be materials of choice for forming row lines or column lines, subtractive patterning of aluminum or copper can be difficult at small geometries, for example, below about 100 nm. In the case of aluminum, for example, substantial portions row lines or column lines can be oxidized between the time when the lines are subtractively etched and the time when gaps between the lines are filled with inter-layer dielectrics. In the case of copper, chemistries for etching copper may not have adequate selectivity against structures to be protected during etching. Therefore, there is a need for flexible process flows where materials chosen to form intermediate structures for one or more features within a cell stack can later be replaced with a desired final material for adequate device performance. In some embodiments, the materials used in the intermediate structures are sufficiently robust to maintain their structural integrity when exposed to various subsequent process environments and may have low reactivity with other adjacent materials.

In the following, various embodiments may be applied to form, for example, memory cells, such as memory cells in cross-point memory arrays. In some embodiments, materials chosen to form intermediate structures for one or more features within a cell stack can later be replaced with a desired final material used to form the final memory cell.

In the following, while a portion of a memory array may be described for clarity, it will be understood that the portion can be representative of and applied across substantially a section of or the entirety of the memory array, according to some embodiments. As described herein, a memory array can be partitioned into multiple sub-arrays, also referred to as "tiles." In addition, a memory array having a plurality of coplanar columns and a plurality of coplanar rows may form a "deck", which can be stacked into multiple decks of memory arrays to form a 3D cross point memory structure. By way of an illustration only, in one example of a phase change memory array, a single deck tile can occupy the same footprint as between about 100 thousand to 16 million memory cells, depending on the number of decks of memory each tile includes. In addition, in some embodiments, various peripheral circuitries, including column line and row line drivers, can be located under the memory array and substantially under the memory cells within a footprint of the active array, under the memory cells, and near the periphery of the sub-arrays for compact chip layout. The column line and row line drivers can be electrically connected to their respective column lines and row lines through vertical connecting members, which can be referred to as sockets. The sockets may be located near an edge, or near a mid-point, depending on the location of the word line driver.

By way of an example only, a rectangular memory array can comprise four equally sized and similarly-shaped rectangular sub-arrays. The memory array includes column lines extending laterally along a first direction (e.g. y-direction) across two sub-arrays. The column lines may be connected vertically to column drivers located under the memory array through sockets. In one example embodiment, the column line drivers can be located near one or both of memory array edges extending in the x-direction. In this embodiment, the sockets for connecting column lines to their drivers can be located below the memory array also near one or both of memory array edges extending in the x-direction. In another embodiment, the column drivers can be located near an intersection of the two sub-arrays extending in the x-direction. In this embodiment, the sockets for connecting column lines to their drivers can be located below the memory array also near located near an intersection of the two sub-arrays extending in the x-direction. The placement of the drivers at certain locations below the memory array can be advantageous for improving certain aspects of the memory array performance. For example, by placing the drivers near an intersection of the two sub-arrays (i.e., within the main array region) instead of near an edge of the main array, the length column lines to be driven from by the column line can be reduced by roughly half. Such a reduction of the length of the column lines can be advantageous, for example, in reducing the IR-drop across the column, as well as reducing the RC delay.

Similarly, in this example, the rectangular memory array comprising four equally sized and similarly-shaped rectangular sub-arrays additionally includes row lines extending laterally along a second direction (e.g., x-direction) across two sub-arrays. Similar to the column lines, the row lines may be connected vertically to row line drivers located under the memory array through sockets, either near one or both of the memory array edges extending in the y-direction, or near an intersection of the two sub-arrays extending in the y-direction. Correspondingly, the sockets for connecting row lines to their drivers can be located below the memory array near one or both of the memory array edges extending in the y-direction, or near an intersection of the two sub-arrays extending in the y-direction. Similar to column lines, by placing the row drivers near an intersection of the two sub-arrays (i.e., within the main array region) instead of near an edge of the main array, the length of row lines to be driven from by the column line can be reduced by roughly half. Such a reduction of the length of the row line can be advantageous, for example, in reducing the 1R-drop across the row line, as well as reducing the RC delay.

With reference again to the figures, FIGS. 3A-3E, 4A-4E, 5A-5E, 6A-6E 7A-7E, and 8A-8E depict array structures 60a-60e, 70a-70e, 80a-80e, 90a-90e, 100a-100e, and 110a-110e, respectively. These Figures illustrate various embodiments of methods of fabricating memory cell structures in a memory array. While not shown for clarity and ease of illustration, it will be understood that the illustrated array structures are formed over a substrate, which can include other memory arrays, which may have features that are formed similarly to the illustrated array, and/or various periphery and supporting circuitry, for instance column and row drivers and sockets connecting the drivers to the column lines and row lines, as described above.

FIGS. 3A-3E show three-dimensional depictions illustrating a method of fabricating a memory array according to some embodiments. The method includes subtractively patterning a lower line stack extending in one direction, e.g., the x-direction. Subtractively patterning the lower line stack comprises providing a lower stack including a lower conductive material and a sacrificial material over the lower conductive material and etching the lower stack to form the lower line stack comprising a sacrificial line over a lower conductive line. The method additionally includes forming an upper chalcogenide line extending in the x-direction by replacing the sacrificial material of the sacrificial line with an upper chalcogenide material. The method further includes subtractively patterning an upper line stack extending in a crossing direction, e.g., the y-direction, different from the x-direction. Subtractively patterning the upper line stack comprises providing an upper stack comprising an upper conductive material over the chalcogenide line and etching the upper stack to form the upper line stack.

As described herein and in subsequent Figures, it will be understood that in various embodiments, positional terms such as "upper" and "lower" are interchangeable. For example, in some embodiments, the lower conductive line can be a row line. In some other embodiments, the lower conductive line can be a column line. Additionally, it will be understood that in this and in subsequent Figures, in some embodiments, the upper conductive line can be a column line while in other embodiments, the upper conductive line can be a row line.

Additionally, as described with respect to this and in subsequent Figures, in some embodiments, the upper phase change material line, e.g. chalcogenide line, can comprise an intermediate or a final structure of a storage element. In other embodiments, the upper line, e.g. chalcogenide line, can comprise an intermediate or a final structure of a selector element. Similarly, in some embodiments, a lower phase change material line, e.g. a chalcogenide line, can comprise an intermediate or a final structure of a storage element while in other some embodiments, the lower line, e.g., a chalcogenide line, can comprise an intermediate or a final structure of a selector element.

Referring to the array structure 60a of FIG. 3A, the method of forming the memory array comprises subtractively patterning a lower line stack extending in the x-direction. The lower line stack comprising a lower conductive line 22 over a substrate, a lower electrode line 32 on the lower conductive line 22, a lower chalcogenide line 34 on the lower electrode line 32, a middle electrode line 36 on the lower chalcogenide line 34, and a sacrificial line 38a on the middle electrode line 36. The lower line stack may be subtractively patterned from a lower stack including layers formed by various materials, including a lower conductive material over the substrate, a lower electrode material on the lower conductive material, a lower chalcogenide material on the lower electrode material, a middle electrode material on the lower chalcogenide material, and a sacrificial material on the middle electrode material.

The lower conductive material includes a conductive and semiconductive material suitable for forming conductive lines 22 to carry electrical current for accessing the memory array. Examples of material for forming conductive lines 22 include n-doped poly silicon, p-doped poly silicon, metals including Al, Cu, and W, conductive metal nitrides including TiN, TaN, and TaCN, among others. The lower electrode material may comprise one or more conductive and semiconductive materials including, for example, n-doped poly silicon and p-doped poly silicon; metals including C, Al, Cu, Ni, Cr, Co, Ru, Rh, Pd, Ag, Pt, Au, Jr, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including RuO2. The lower chalcogenide material can be one of the chalcogenide materials described above suitable as a storage element or a selector element. The middle electrode material may comprise any of the conductive and semiconductive materials and combinations thereof described above for the lower electrode material.

The first sacrificial material can be a material that is compatible with subsequent isolation patterning and fill processes. The first sacrificial material may be a material having sufficient mechanical robustness and sufficient chemical stability to withstand isolation fill processes, or other processes where a material is deposited into open space between features formed by the first sacrificial material. In some embodiments, the first sacrificial material comprises a stack including a material different from the dielectric material used in the subsequent isolation fill process. In some embodiments, the first sacrificial material includes a polyimide bottom material and a top graphitic carbon material. In other embodiments, the first sacrificial material includes bottom silicon oxide material and a top graphitic carbon material. In other embodiments, the first sacrificial material includes aluminum nitride (AlN). In yet other embodiments, the first sacrificial material includes silicon.

Still referring to FIG. 3A, subsequent to providing the lower chalcogenide stack as discussed above, subtractively patterning the lower line stack further includes etching the lower stack to form the lower line stack. As mentioned above, "subtractive patterning" refers to a set of process steps where structures to be defined are patterned by the removal of material. For example, a "subtractive patterning process" may include first lithographically providing etch mask structures overlapping areas to be patterned, followed by etching, such that materials in areas masked by the mask structures are protected while materials in exposed areas are removed by the etch removal process. The set of process steps for subtractive-patterning a stack of layers, can include, for example, providing an etch mask pattern that can comprise at least one of a photoresist, a hard mask, and an anti-reflective coatings, among others by a photolithography process. The etch mask pattern blocks areas covered by the mask pattern to protect the underlying material from being etched by an etchant (e.g., wet or dry), while the etch mask pattern exposes areas not covered by the mask pattern to etch the exposed region to be etched by the etchant.

In the illustrated embodiment in FIG. 3A, subtractively patterning includes forming an etch mask pattern comprising lines extending in the x-direction. Subsequently, using the patterned etch mask, exposed regions of the lower material stack between lines of the etch mask pattern are etched. In the embodiment of FIG. 3A, the lower material stack is etched from the top, in the order of the sacrificial material, the middle electrode material, the lower chalcogenide material, the lower electrode material, and the lower conductive line material. The lower material stack is selectively etched to form the lower line stack extending in the x-direction, and comprises lower conductive lines 22, lower electrodes 32 on lower conductive lines 22, lower chalcogenide lines 34 on lower electrodes 32, middle electrode lines 36 on lower chalcogenide lines 34, and first sacrificial lines 38a on middle electrode lines. Once the row line stacks are formed, spaces between adjacent row line stacks are filled with a dielectric to form isolation dielectric regions 44. A suitable dielectric can include, for example, dielectric materials capable of filling spaces having relatively small space widths (e.g., less than about 100 nm) and relatively high aspect ratios (e.g., higher than about 5:1 in height to width ratio of the space). Suitable isolation dielectric materials include silicon oxides and silicon nitrides deposited by high-density plasma (HDP) processes, spin-on-dielectric (SOD) processes, sub-atmospheric chemical vapor deposition (SACVD) processes, and atomic layer deposition (ALD) processes, among others. Once the inter-line space is filled with the suitable isolation dielectric to form the isolation dielectric regions 44, the array structure 60a is chemical-mechanically polished to expose alternating lines comprising the sacrificial material 38a and isolation dielectric regions 44.

As described in reference to the embodiment of FIGS. 3A-3E and to all other embodiments described herein, pitch multiplication techniques, such as self-aligned double patterning (SADP) techniques, may be utilized to form the row line stacks (e.g., the stack including 22, 32, 34, 36, and 38a in FIG. 3A) and the column line stacks (e.g., the stack including 20e, 40e, and 38e in FIG. 3E) for cross-point memory arrays. Utilization of an SADP or other pitch multiplication technique to form the row line stacks and the column line stacks allows formation of features having dimensions smaller than would otherwise be possible utilizing standard lithographic techniques, and therefore greater memory density may be achieved, among other potential benefits including improved power consumption and device performance, for example. The process is dubbed "self-aligned" because a lithography-defined set of features can be used to derive a denser pattern of features that are self-aligned (without a further mask) to the lithography-defined set of features. For example, photolithography can define a plurality of elongated mask lines, and conformal deposition of a spacer layer over the mask lines, followed by etching (e.g., directional etching) to leave spacers along sidewalls of the mask lines, can define two spacer lines for every one mask line. After removal of the mask lines, the spacer lines are left with half the pitch (the spacing between like parts of like features in a repeated pattern) and double the density of the original mask lines. The process is said to be "pitch doubling" employing the converse meaning of pitch to be synonymous with density. Furthermore, by repeating the pitch doubling technique twice, spacer lines having a quarter of the pitch and quadruple the density of the original mask lines may be formed. The process is said to be "pitch quadrupling," which is an extension of pitch doubling. More generally therefore, techniques that form multiple features for a single conventionally defined (e.g., photolithographically defined) feature is known as "pitch multiplication."

Figure 3B:
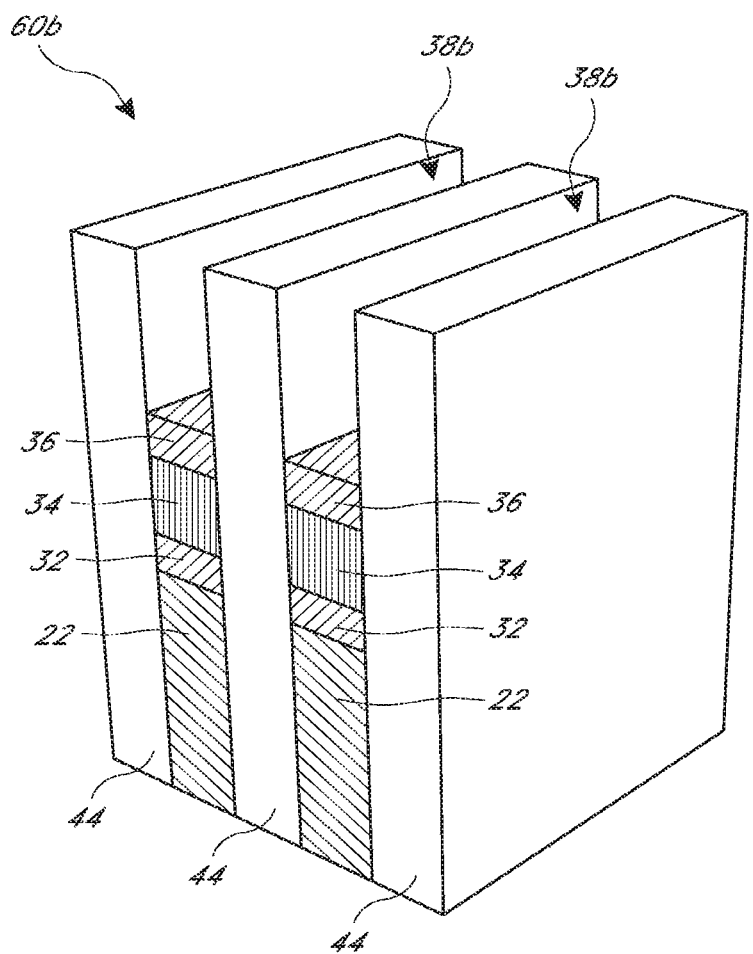
Figure 3B:
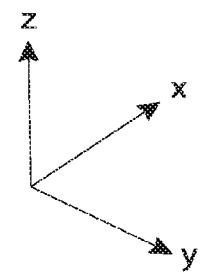

Referring to the array structure 60b of FIGS. 3B and 3C, the method of fabricating the memory array additionally comprises forming an upper chalcogenide line 38c (FIG. 3C) extending in the x-direction by replacing the sacrificial material of the sacrificial line 38a (FIG. 3A) with an upper chalcogenide material 38c. Forming the upper chalcogenide line 38c includes performing a self-aligned selective etching to remove the sacrificial material from the sacrificial line 38a in FIG. 3A, to create gaps 38b in FIG. 3B extending in the x-direction. The selective removal process employs suitable etching chemistries (e.g., dry or wet) to remove the sacrificial material from the sacrificial line 38a in FIG. 3A without substantially removing the isolation dielectric material. As described herein and in subsequent embodiments, "self-aligned selective etching" refers to etching processes that do not require a lithography to perform the etching, where the etch chemistry is sufficient to achieve material removal ratio exceeding about 10:1 in some embodiments. In other embodiments, the material removal ratio exceeds about 50:1. For example, in one embodiment where the first sacrificial material includes a polyimide bottom layer and a top graphitic carbon layer, the etch chemistries can include an O2 plasma for dry removal of the top graphitic carbon layer and an organic solvent to remove the polyimide bottom imide layer. In another embodiment where the first sacrificial material includes bottom silicon oxide layer deposited by ALD and a top graphitic carbon layer, the etch chemistries can include an O2 plasma for removal of the top graphitic carbon layer and a solution comprising dilute hydrofluoric acid (HF) for removal of the ALD silicon oxide layer. In another embodiment where the first sacrificial material includes an aluminum nitride layer, the etch chemistry can include hot water vapor (H2O). In yet another embodiment where the first sacrificial material includes silicon, the etch chemistry can include a solution comprising potassium hydroxide (KOH) or tri-methyl ammonium hydroxide.

Referring to the array structure 60c of FIG. 3C, the gaps 38b of FIG. 3B created by performing a self-aligned selective etching process to remove the sacrificial materials from the sacrificial lines 38a of FIG. 3A are filled with the upper chalcogenide material. After filling the gaps 38b with the upper chalcogenide material, the surface of the array structure 60c is planarized via a chemical-mechanical polishing (CMP) process to remove excess upper chalcogenide material, leaving exposed alternating lines of upper chalcogenide lines 38c and spaces comprising isolation dielectric regions 44. The resulting upper chalcogenide lines 38c are disposed on the middle electrode lines 36 and extend in the x-direction. The upper chalcogenide line 38c is electrically confined in the y-direction by adjacent isolation dielectric regions 44.

Referring to FIG. 3D, in some embodiments, the method of fabricating a memory array additionally includes forming a third electrode line 40d extending in the x-direction by replacing a portion of the upper chalcogenide material of the upper chalcogenide line 38c (FIG. 3C) with a third electrode material. In these embodiments, the upper chalcogenide material of the upper chalcogenide line 38c is partially removed with a chalcogenide etchant (dry or wet) to form a second gap extending in the x-direction. The second gap is subsequently filled, e.g. with the third electrode material, and excess third electrode material is removed by a CMP process. The resulting third electrode line 40d is disposed on the upper chalcogenide line 38d and extends in the x-direction. The third electrode line 40d is electrically confined in the y-direction by adjacent isolation dielectric regions 44.

Figure 3E:
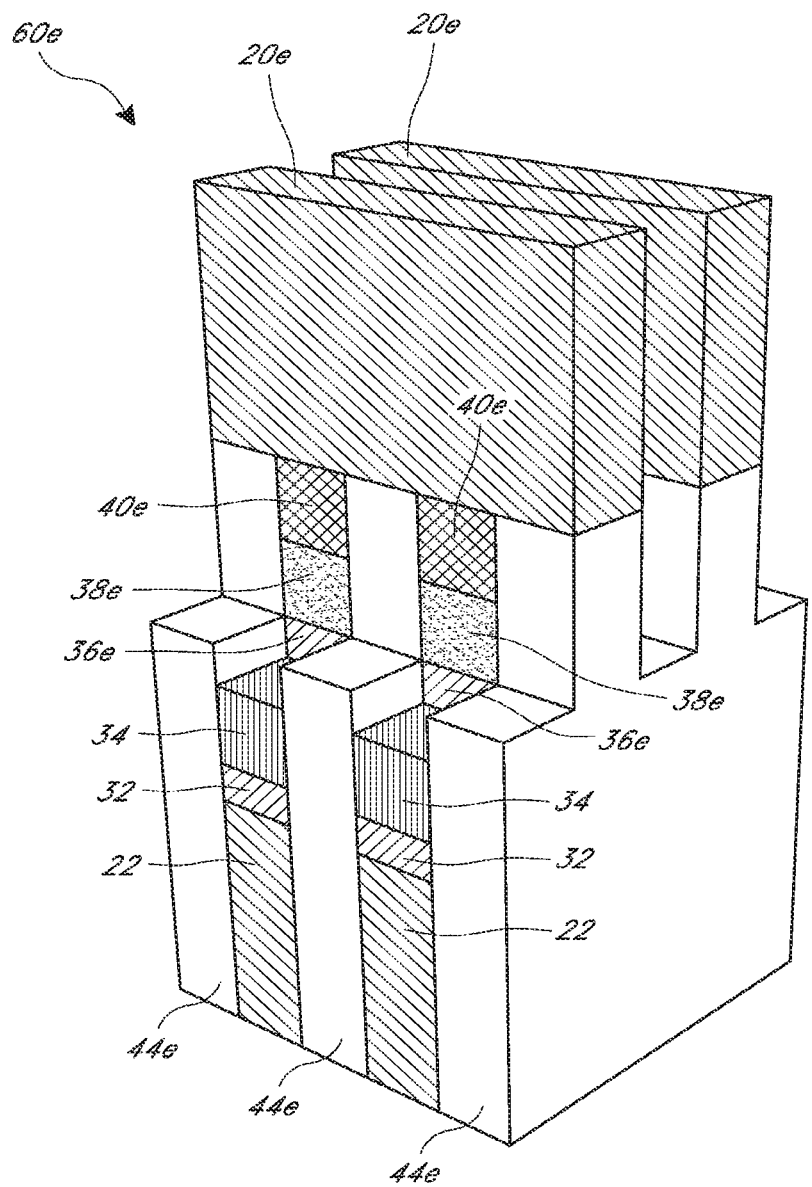

Referring to the array structure of FIG. 3E, the method of fabricating the memory array further includes subtractively patterning an upper line stack extending in the y-direction. In some embodiments, the x and y directions can be substantially orthogonal to each other in a plane, for instance by forming an angle between about 80 and about 100 degrees. Subtractively patterning the upper line stack comprises providing an upper stack comprising an upper conductive material over the upper chalcogenide line. Subtractively patterning the upper line stack also includes etching the upper chalcogenide material and an upper conductive material over the upper chalcogenide material to form an upper conductive line 20e extending in the y-direction and a two-dimensionally confined upper chalcogenide elements 40e. In addition, when third electrode lines 40d are formed as illustrated in FIG. 3D, the method of subtractively patterning the upper stack additionally includes etching the third electrode line 40d to form two-dimensionally confined third electrodes 40e.

FIGS. 4A-4E show three-dimensional depictions illustrating a method of fabricating a memory array according to some other embodiments. The method includes subtractively patterning a lower line stack extending in the x-direction. The lower line stack (FIG. 4A) comprises lower conductive lines 22 on a substrate, lower electrode lines 32 on lower conductive lines 22, lower chalcogenide lines 34 on lower electrode lines 32, middle electrodes lines 36a on lower chalcogenide lines 34, upper chalcogenide lines 38a on middle electrode lines 36a, and upper electrode lines 40a on upper chalcogenide lines. The lower line stack is formed by subtractively etching a lower stack including layers of materials for forming, respectively, the above-noted features, including a lower conductive material over the substrate, a lower electrode material on the lower conductive material, a lower chalcogenide material on the lower electrode material, a middle electrode material on the lower chalcogenide material, an upper chalcogenide material on the middle electrode material, and an upper electrode material on the upper chalcogenide material. The method additionally includes subtractively patterning an upper line stack extending in a y-direction different from the x-direction. Subtractively patterning the upper line stack comprises providing and etching an upper stack including a sacrificial material (FIG. 4B) over the lower chalcogenide line 38a to form the upper line stack comprising a sacrificial line 20b. The method further includes forming an upper conductive line 20e (FIG. 4E) extending in the y-direction by replacing the sacrificial material of the sacrificial line 20c (FIG. 4C) with an upper conductive material.

Referring to the array structure 70a of FIG. 4A, the method of forming the memory array includes subtractively patterning a lower line stack extending in the x-direction. The lower stack includes a lower conductive material 22 over the substrate, a lower electrode material 32 on the lower conductive material, a lower chalcogenide material 34 on the lower electrode material 32, a middle electrode material 36a on the lower chalcogenide material, an upper chalcogenide material 38a on the middle electrode material, and an upper electrode material 40a on the upper chalcogenide material.

It will be understood that the lower conductive material includes a suitable conductive and semiconductive material for forming conductive lines to carry electrical current for accessing the memory array, discussed above in connection with FIG. 3A. Similarly, electrode materials (e.g., the lower and middle electrode materials and 36a) can comprise any suitable conductive and semiconductive materials discussed above in connection with electrode materials in FIG. 3A. Furthermore, the lower and upper chalcogenide materials and can be one of the chalcogenide materials described above suitable as a storage element or a selector element.

Still referring to FIG. 4A, after providing the lower chalcogenide stack as discussed above, subtractively patterning includes forming an etch template comprising lines extending in the x-direction. Subsequently, using the etch template, subtractive patterning includes etching the lower chalcogenide material stack described above in the exposed regions between the template lines. In the embodiment of FIG. 4A, the lower material stack is etched from the top, in the order of the upper electrode material, the upper chalcogenide material, the middle electrode material, the lower chalcogenide material, the lower electrode material, and the lower conductive line material. The material stack is etched to form the lower line stack, which can be a row line stack in some embodiments. The lower line stack extends in the x-direction and comprises lower conductive lines 22 on the substrate, lower electrode lines 32 on lower conductive lines 22, lower chalcogenide lines 34 on lower electrode lines 32, middle electrodes lines 36a on lower chalcogenide lines 34, upper chalcogenide lines 38a on middle electrode lines 36a, and upper electrode lines 40a on upper chalcogenide lines. Once the lower line stacks are formed, spaces between adjacent lower line stacks are filled with a dielectric to form isolation dielectric regions 44a. A suitable isolation dielectric can include, for example, dielectrics capable of filling relatively small space widths (e.g., less than about 100 nm) and relatively high aspect ratios (e.g., higher than 5:1 in height to width ratio of the space), similar to those discussed above in connection with FIG. 3A. Once the inter-line space is filled with dielectric to form the isolation dielectric regions 44a, the array structure 70a is chemical-mechanically polished to leave exposed alternating lines comprising the top electrode lines 40a and isolation dielectric regions 44a.

Figure 4B:
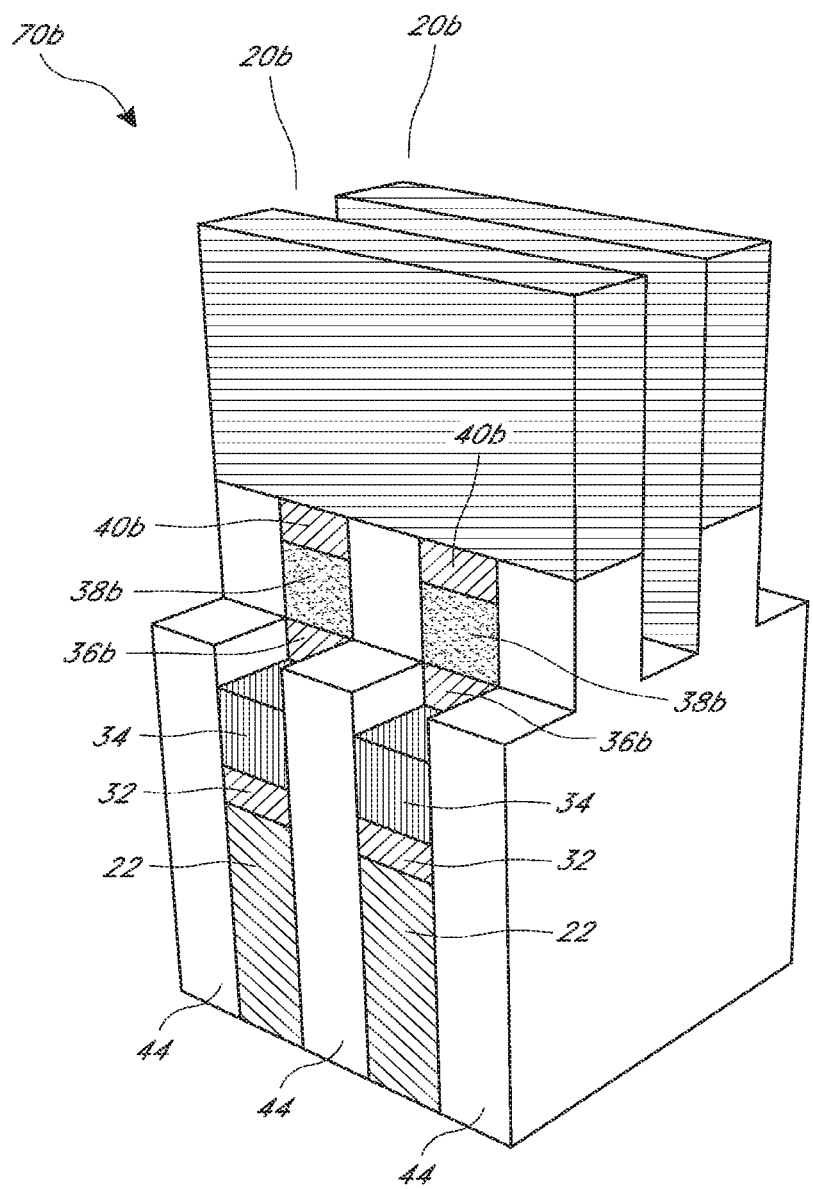

Referring to the array structure 70b of FIG. 4B, the method of fabricating a memory array additionally includes subtractively patterning an upper line stack extending in the y-direction. Subtractively patterning the upper line stack includes providing an upper stack including a sacrificial material over the lower stack. The sacrificial material may be any material that is compatible with subsequent isolation patterning and fill processes. The sacrificial material is a material having sufficient mechanical robustness and sufficient chemical stability to withstand isolation fill processes, or other processes where a material is deposited into open space between features formed by the first sacrificial material, similar to those discussed in connection with FIG. 3A. Similar to FIG. 3A, in some embodiments, the sacrificial material comprises a multi-layer stack including at least one material different from the dielectric material used in the subsequent isolation fill process. Example embodiments include materials described above in connection with FIG. 3A.

Referring to FIG. 4B, subtractively patterning the upper line stack includes forming an etch template comprising lines extending in the y-direction. Subsequently, using the patterned etch template, the upper line stack is etched in the exposed regions between the template lines. In the embodiment of FIG. 4B, the upper material stack is etched from the top by first etching the sacrificial material to form sacrificial lines 20b extending in the y-direction. Subsequently, etching can continue to remove portions of the upper electrode lines 40a, upper chalcogenide lines 38a, and middle electrode lines 36a of FIG. 4A to form upper electrodes 40b, upper chalcogenide elements 38b, and middle electrodes 36b of FIG. 4B, which are electrically isolated in both x and y directions.

Figure 4C:
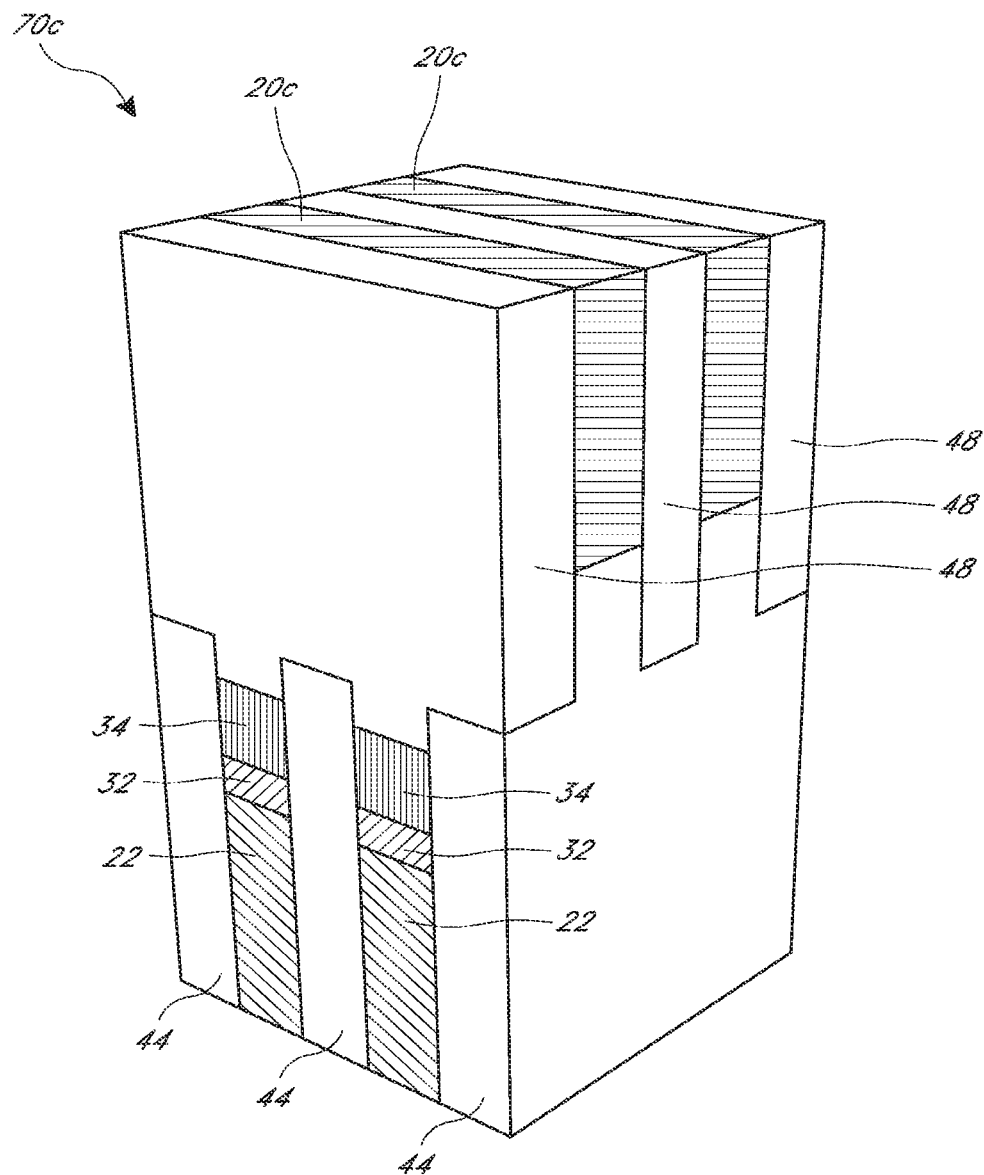

Referring to FIG. 4C, after the upper line stack is etched to form the array structure 70b (FIG. 4B), open spaces between adjacent upper line stacks are filled with a dielectric to form isolation dielectric regions 48. A suitable isolation dielectric can be similar (in composition and/or properties) to the dielectric used to form isolation dielectric regions 44 between lower line stacks. Once the inter-line spaces are filled with the dielectric to form isolation dielectric regions 48, the array structure 70c is chemical-mechanically polished to remove excess isolation dielectric, leaving exposed alternating lines of sacrificial lines 20c and isolation dielectric regions 48. The resulting sacrificial lines 20c extend in the y-direction and are disposed on the upper chalcogenide elements (similar to 38b of FIG. 4B, hidden from view by isolation dielectric regions 44) or upper electrodes (similar to 40b of FIG. 4B, hidden from view by isolation dielectric regions 44).

Figure 4D:
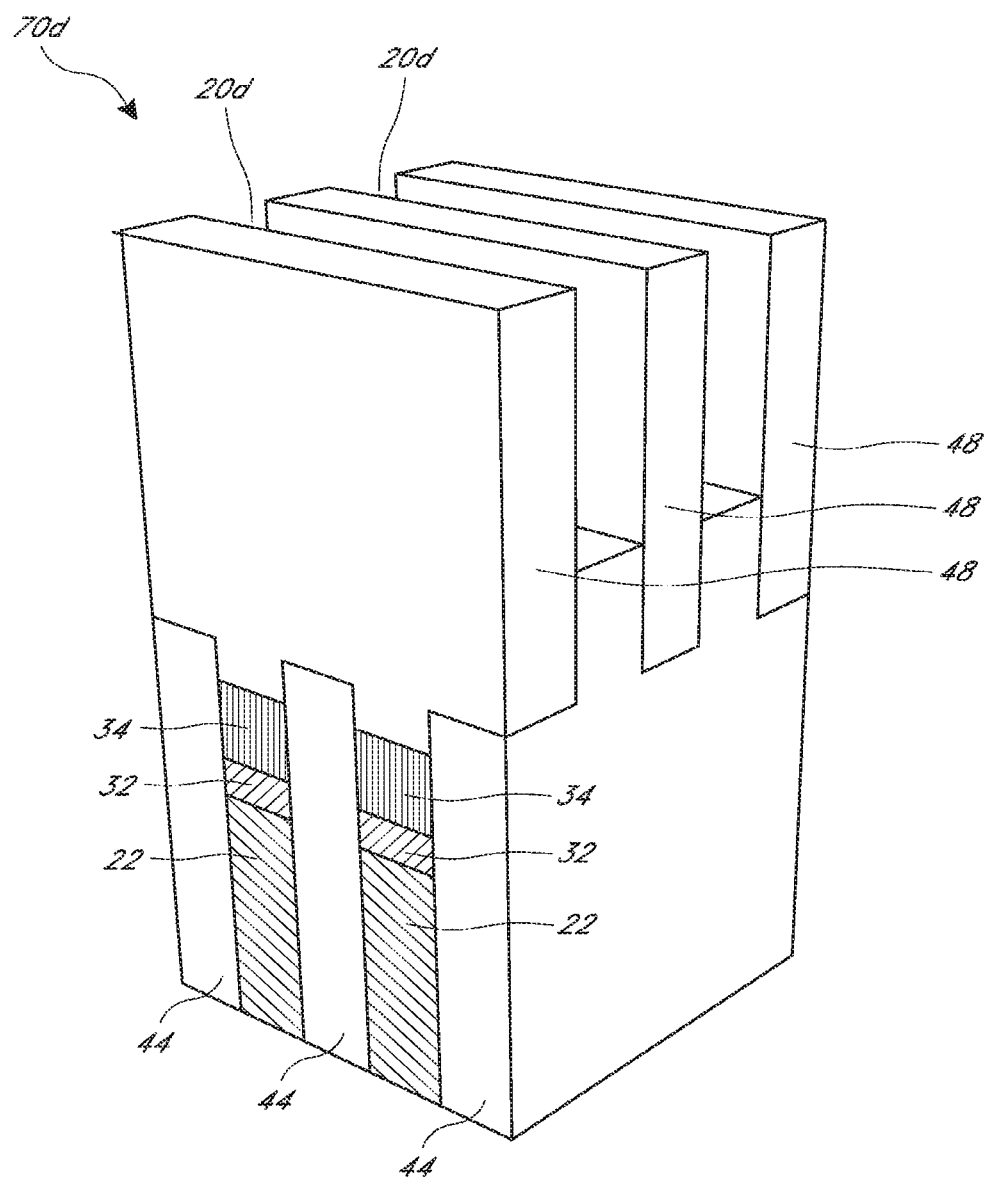
Figure 4D:
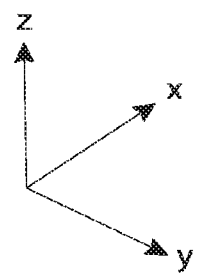
Figure 4E:
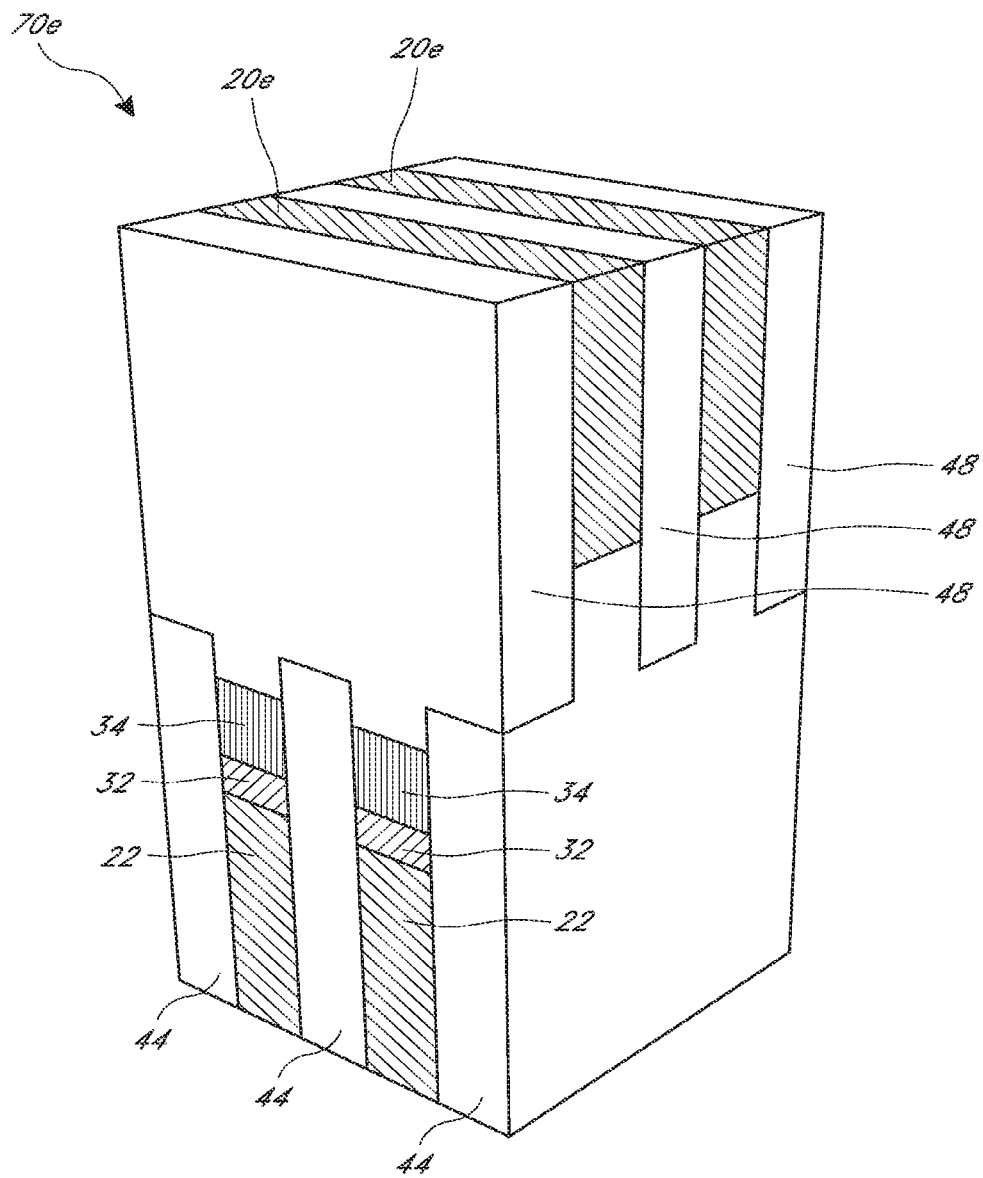

Referring to the array structure 70d and 70e of FIGS. 4D and 4E, an upper conductive line 20e extending in the y-direction is formed by selectively removing the sacrificial material of the sacrificial line 20c (FIG. 4C) and replacing with an upper conductive material to form the upper conductive line 20e. Referring to FIG. 4D, forming the upper conductive line 20e includes removing the sacrificial material from the sacrificial line 20c through a self-aligned selective etching process to create gaps 20d extending in the y-direction. The selective removal process employs etching chemistries (e.g., dry or wet) that remove the sacrificial material from the sacrificial line 38b without substantially removing the isolation dielectric material.

Referring to FIG. 4E, the gaps 20d of FIG. 4D created by selectively removing the sacrificial lines 20c are filled with the upper conductive material to form upper conductive lines 20e. After filling the gaps 20d with the upper conductive material, the surface of the array structure 70e is planarized via a CMP process to removes excess upper conductive material, leaving exposed alternating lines of upper conductive lines 20e and spaces comprising isolation dielectric regions 48. The resulting upper conductive lines 20e are disposed on upper chalcogenide elements (which are hidden from view by isolation dielectric regions 44 and are similar to 38b in FIG. 4B,) or, alternatively in some embodiments, upper electrodes (similar to 40b in FIG. 4B, hidden from view by isolation dielectric regions 48), and extend in the y-direction. The upper conductive lines 38e are electrically confined in the y-direction by adjacent spaces comprising isolation dielectric regions 48.

Figure 5B:
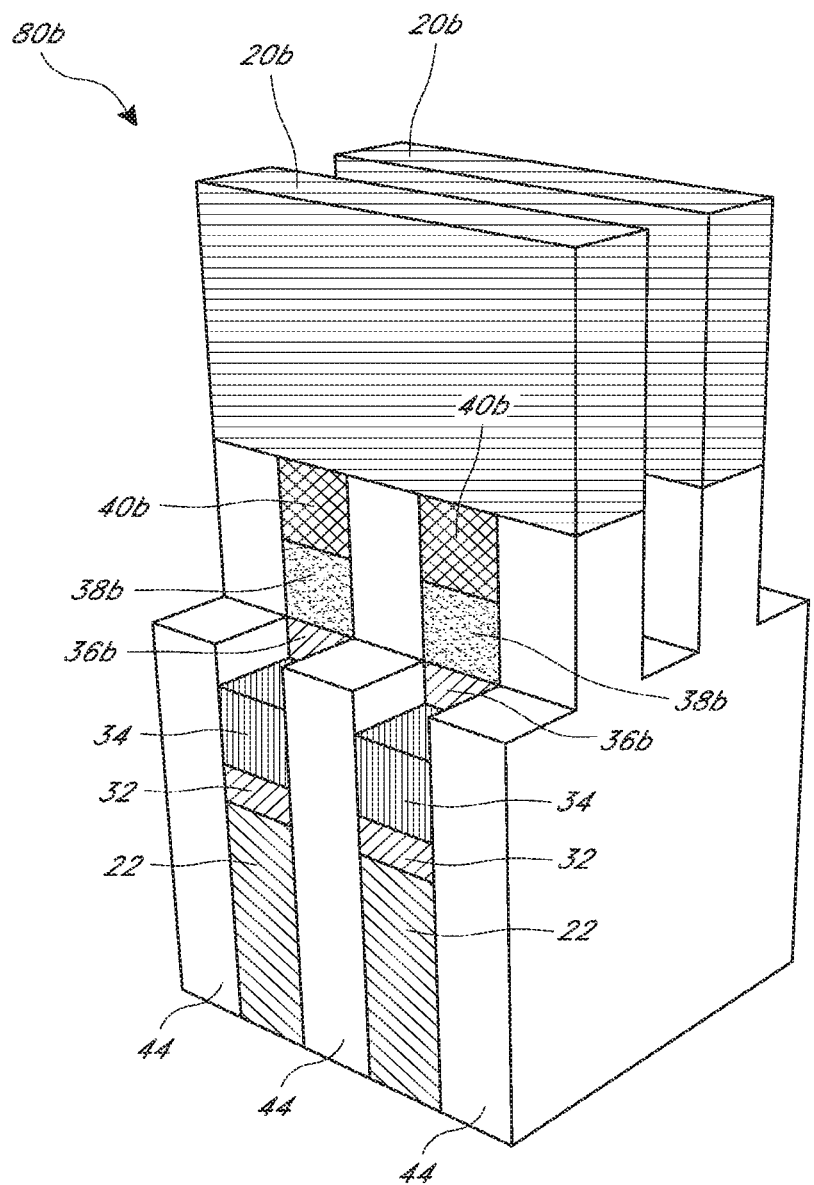

FIGS. 5A-5E show three-dimensional depictions illustrating a method of fabricating a memory array according to some other embodiments. Process steps employed to arrive at the array structure 80a of FIG. 5A are similar to the process steps described in FIGS. 3A-3D. The method includes subtractively patterning a lower line stack extending in the x-direction. Subtractively patterning the lower line stack comprises providing and etching to form a lower line stack including a lower conductive line 22 on a substrate, a lower electrode line 32 on the lower conductive line 22, a lower chalcogenide line 34 on the lower electrode line 32, a middle electrode line 36a on the lower chalcogenide line 34, and a first sacrificial line (not shown here, similar to sacrificial line 38c of FIG. 3C) on the middle electrode line 36a. The method additionally includes forming an upper chalcogenide line 38a extending in the first direction by replacing the first sacrificial material of the first sacrificial line with an upper chalcogenide material. The method further includes subtractively patterning an upper line stack extending in the y-direction different from the x-direction. Subtractively patterning the upper line stack comprises providing an upper stack including a second sacrificial material 20b over the lower line stack and etching the upper stack to form the upper line stack comprising a second sacrificial line 20c in FIG. 5C. The method further includes forming an upper conductive line 20e in FIG. 5E extending in the y-direction by replacing the second sacrificial material of the second sacrificial line 20c in FIG. 5C with an upper conductive material.

Referring to FIG. 5A, the method of fabricating the memory array comprises subtractively patterning a lower line stack extending in the x-direction, similar to the method described in connection with FIGS. 3A-3D. Similar to FIGS. 3A-3D, subtractively patterning the lower line stack comprises providing and etching a lower stack including a lower conductive material on the substrate, a lower electrode material on the lower conductive material, a lower chalcogenide material on the lower electrode material, a middle electrode material on the lower chalcogenide material, and a first sacrificial material on the middle electrode material to form the lower line stack comprising lower conductive lines 22 over the substrate, lower electrode lines 32 on the lower conductive lines 22, lower chalcogenide lines 34 on lower electrode lines 32, middle electrode lines 36a on lower chalcogenide lines 34, and first sacrificial lines (not shown) on the middle electrode lines 36a. After etching and filling spaces between the lower line stacks as described in FIGS. 3A-3D, upper chalcogenide lines 38a are formed by selectively removing the first sacrificial material of the first sacrificial line and replacing with an upper chalcogenide material. In addition, the array structure 80a represents an array structure similar to the array structure 60d of FIG. 3D, in which a third electrode line 40a is formed by replacing at a portion of the upper chalcogenide material of the upper chalcogenide line 38a with an upper electrode material. In this embodiment, as discussed in connection with the array structure 60d of FIG. 3D, after a portion of the upper chalcogenide material is replaced with the upper electrode material, the array structure is subsequently planarized and leave exposed alternating lines comprising the upper electrode lines 40a and isolation dielectric regions 44a. In addition, similar to FIG. 3D, the resulting upper electrode line 40a is disposed on the upper chalcogenide line 38a and is electrically confined in the y-direction by adjacent isolation dielectric regions 44a.

While the arrangement depicted in FIG. 5A includes the third electrode line 40a, in some embodiments (not shown), the third electrode line 40a may be omitted. In these embodiments, as discussed in connection with the array structure 60c of FIG. 3C, after the gaps are created and filled with the upper chalcogenide material, the array structure is subsequently planarized and leave exposed alternating lines comprising the upper chalcogenide lines 38a and spaces comprising isolation dielectric regions 44a.

Figure 5C:
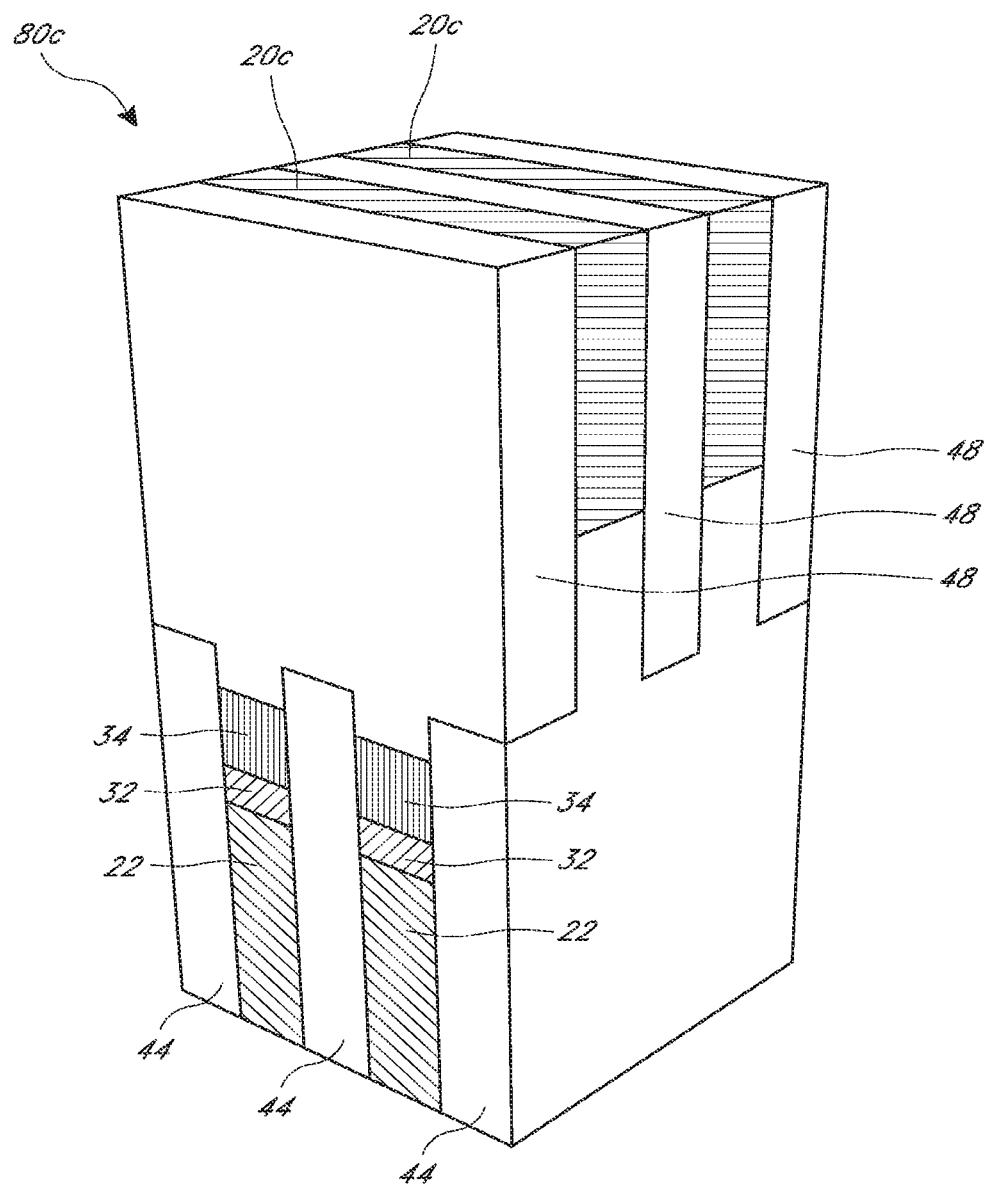

Referring to FIG. 5B-5C, an upper line stack extending in the y-direction is formed by subtractive patterning, similar to the method described in connection with FIGS. 4B-4E. Subtractively patterning the upper line stack comprises providing an upper stack including a second sacrificial material over the lower line stack, etching the upper stack to form the upper line stack comprising a second sacrificial line, and forming an upper conductive line extending in the y-direction by replacing the second sacrificial material of the second sacrificial line with an upper conductive material.

In more detail, referring to the array structure 80b of FIG. 5B, similar to FIG. 4B, subtractively patterning the upper line stack includes subtractively etching the upper line stack in the exposed regions between the template lines. Similar to FIG. 4B, the upper material stack is etched from the top by first etching the second sacrificial material to form sacrificial lines 20b extending in the y-direction. Subsequently, etching can continue to remove portions of the upper electrode line, the upper chalcogenide line, and the middle electrode line to form upper electrodes 40b, upper chalcogenide elements 38b, and middle electrodes 36b. In this way, upper electrodes 40b, upper chalcogenide elements 38b, and middle electrodes 36b are electrically isolated in both x and y directions.

Referring to the array structure 80c of FIG. 5C, similar to FIG. 4C, spaces between adjacent upper line stacks are filled with a dielectric to form isolation dielectric regions 48, and the array structure 80c is subsequently planarized to remove excess dielectric, leaving exposed alternating lines of sacrificial lines 20c and spaces comprising isolation dielectric regions 48.

Figure 5D:
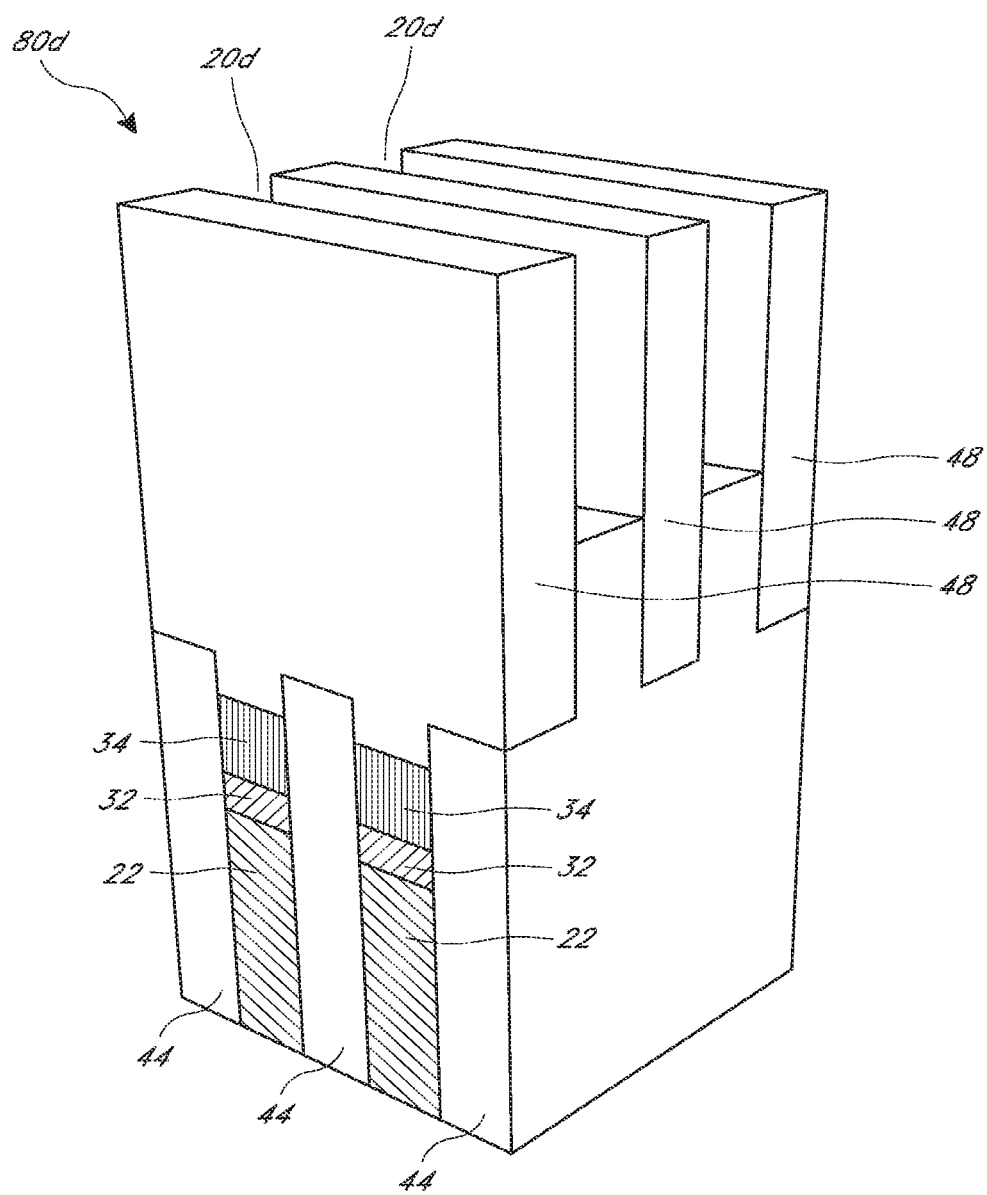
Figure 5E:
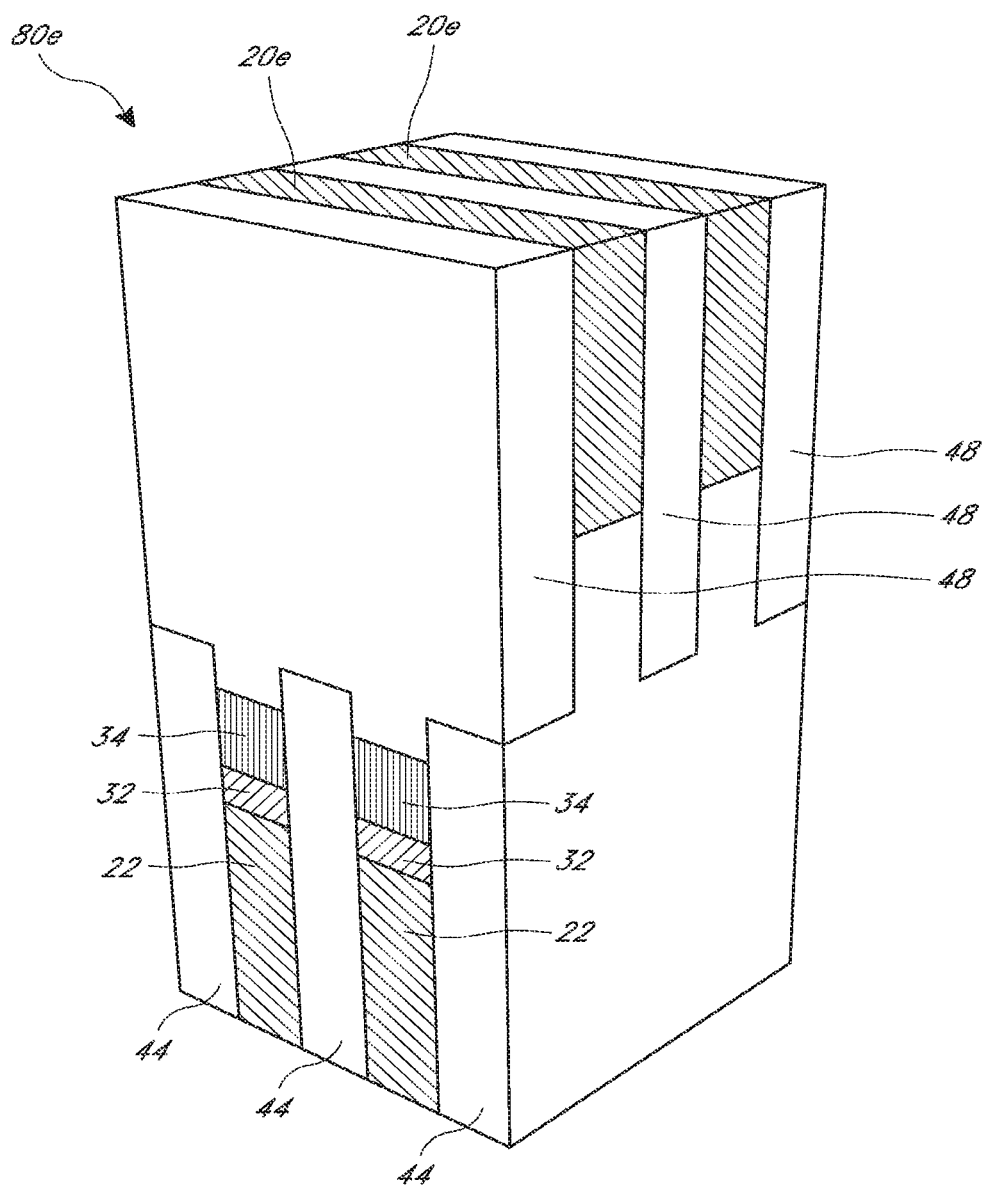

Referring to the array structures 80d and 80e of FIGS. 5D and 5E, forming the upper conductive line extending in the y-direction further comprises replacing the sacrificial material of the sacrificial line 20c of FIG. 5C with an upper conductive material to form an upper conductive line 20e extending in the y-direction. Similar to FIG. 4D, forming the upper conductive line 20e includes performing self-aligned selective etching to remove the sacrificial material from the sacrificial line 20c, to create gaps 20d. Subsequently, similar to FIG. 4E, the gaps 20d are filled with the upper conductive material. After filling the gaps 20e, the surface of the array structure 70e is planarized via a CMP process to removes excess upper conductive material, leaving exposed alternating lines of upper conductive lines 20e and isolation dielectric regions 48. The resulting upper conductive lines 20e are disposed on the upper chalcogenide elements (similar to 38b of FIG. 5B, hidden from view by isolation dielectric regions 48) or, alternatively in some embodiments, upper electrodes (similar to 40b of FIG. 5B, hidden from view by isolation dielectric regions 48), and extend in the y-direction. The upper conductive lines 20e are electrically confined in the x-direction by adjacent spaces comprising isolation dielectric regions 48.

Figure 6B:
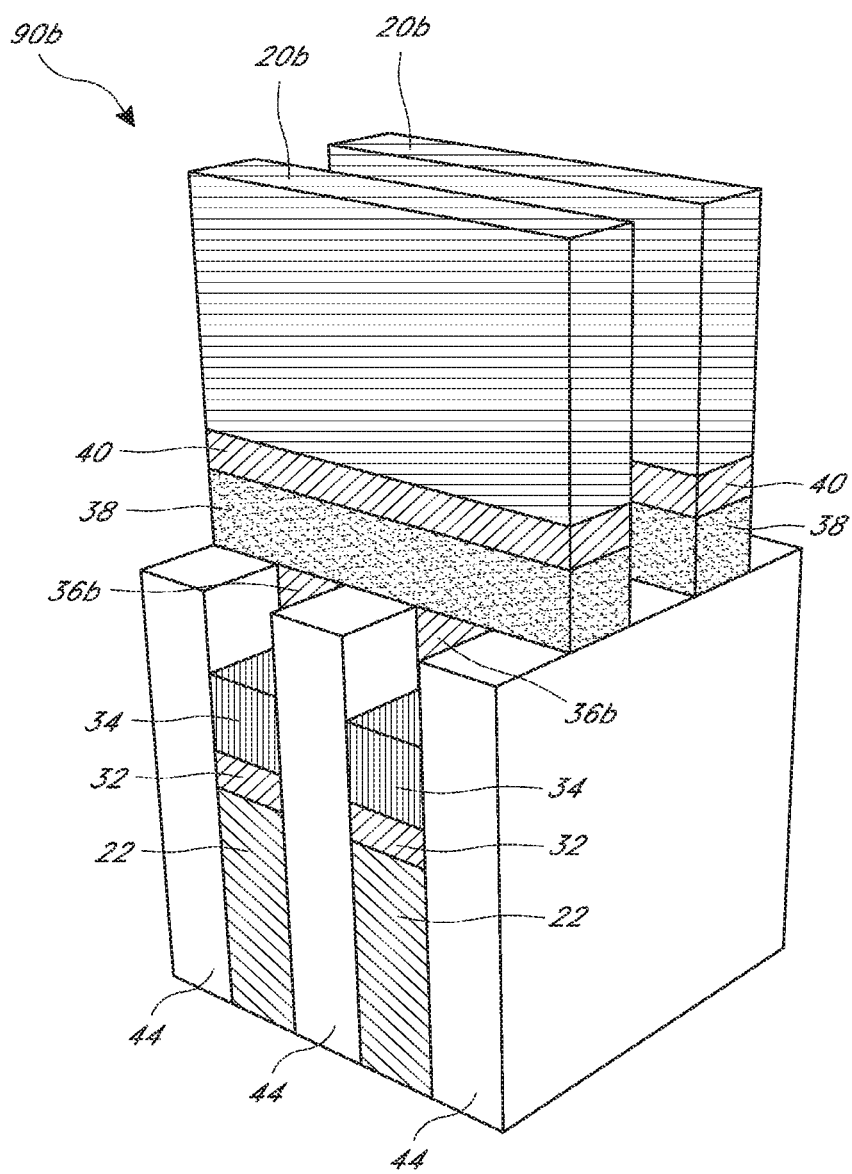

FIGS. 6A-6E show three-dimensional depictions illustrating a method of fabricating a memory array according to some other embodiments. The method includes subtractively patterning a lower line stack extending in the x-direction. Subtractively patterning the lower line stack comprises providing a lower stack including a lower conductive material and a lower chalcogenide material over the lower conductive material and etching the lower stack to form the lower line stack comprising a lower chalcogenide line 34 over a lower conductive line 22 (FIG. 6A). The method additionally includes subtractively patterning an upper line stack extending in a y-direction different from the x-direction. Subtractively patterning the upper line stack comprises providing an upper stack including a sacrificial material 20c (FIG. 6C) over an upper chalcogenide material 38 and etching the upper stack to form the upper line stack comprising a sacrificial line 20c over an upper chalcogenide line 38. The method further includes forming an upper conductive line 20e extending in the y-direction by replacing the sacrificial material of the sacrificial line 20c with an upper conductive material.

Referring to the array structure 90a of FIG. 6A, forming the memory array includes subtractively patterning a lower line stack extending in the x-direction. Subtractively patterning a lower line stack comprises providing and etching a lower stack to form a lower conductive line 22 over a substrate, a lower electrode line 32 on the lower conductive line 22, a lower chalcogenide line 34 on the lower electrode line 32, and a middle electrode line 36a on the lower chalcogenide line 34. The lower line stack may be subtractively patterned from a lower stack including layers formed by various materials, including a lower conductive material over the substrate, a lower electrode material on the lower conductive material, a lower chalcogenide material on the lower electrode material, and a middle electrode material on the lower chalcogenide material.

The lower conductive material includes a conductive and semi conductive material for forming conductive lines to carry electrical current for accessing the memory array, as discussed above in connection with FIG. 3A. Similarly, the electrode materials may comprise conductive and semiconductive materials as discussed above in connection with electrode materials in FIG. 3A. The lower and upper chalcogenide materials can be chalcogenide materials described above and suitable as a storage element or a selector element.

Still referring to FIG. 6A, after providing the lower stack as discussed above, subtractively patterning includes forming an etch template comprising lines extending in the x-direction and subsequently using the etch template to subtractively pattern the lower stack through the exposed regions between the template lines. In the embodiment of FIG. 6A, the lower material stack is etched from the top, in the order of the middle electrode material, the lower chalcogenide material, the lower electrode material, and the lower conductive line material. The material stack is etched to form the lower line stack, e.g., a row line stack, extending in the x-direction, and comprising lower conductive lines 22 on the substrate, lower electrode lines 32 on lower conductive lines 22, lower chalcogenide lines 34 on lower electrode lines 32, and middle electrodes 36a on lower chalcogenide lines 34. Once the lower line stacks are formed, open spaces between adjacent lower line stacks are filled with a dielectric and chemical-mechanically polished to form an isolation dielectric region 44, in a substantially similar manner as discussed in connection with FIG. 4A, leaving exposed alternating lines comprising the middle electrode lines 36a and spaces comprising isolation dielectric regions 44.

Referring to the array structure 90b of FIG. 6B, the method of fabricating a memory array further includes subtractively patterning an upper line stack extending in a y-direction. Subtractively patterning the upper line stack includes providing an upper stack including an upper chalcogenide material on the lower line stack, an upper electrode material on the upper chalcogenide material, and a sacrificial material on the upper electrode material.

Still referring to FIG. 6B, subtractively patterning the upper line stack further includes forming an etch template etching the upper line stack in the exposed regions between the template lines In the embodiment of FIG. 6B, the upper material stack is etched from the top by first etching the sacrificial material 20b, the upper electrode material, and the upper chalcogenide material to form an upper line stack extending in the y-direction including upper chalcogenide lines 38 on the lower line stack, upper electrode lines 40 on upper chalcogenide lines 38, and sacrificial lines 20b on upper electrode lines 38. In addition, subtractive etching can continue to remove portions of the middle electrode line to form middle electrodes 36b that are electrically isolated in both x and y directions.

Figure 6C:
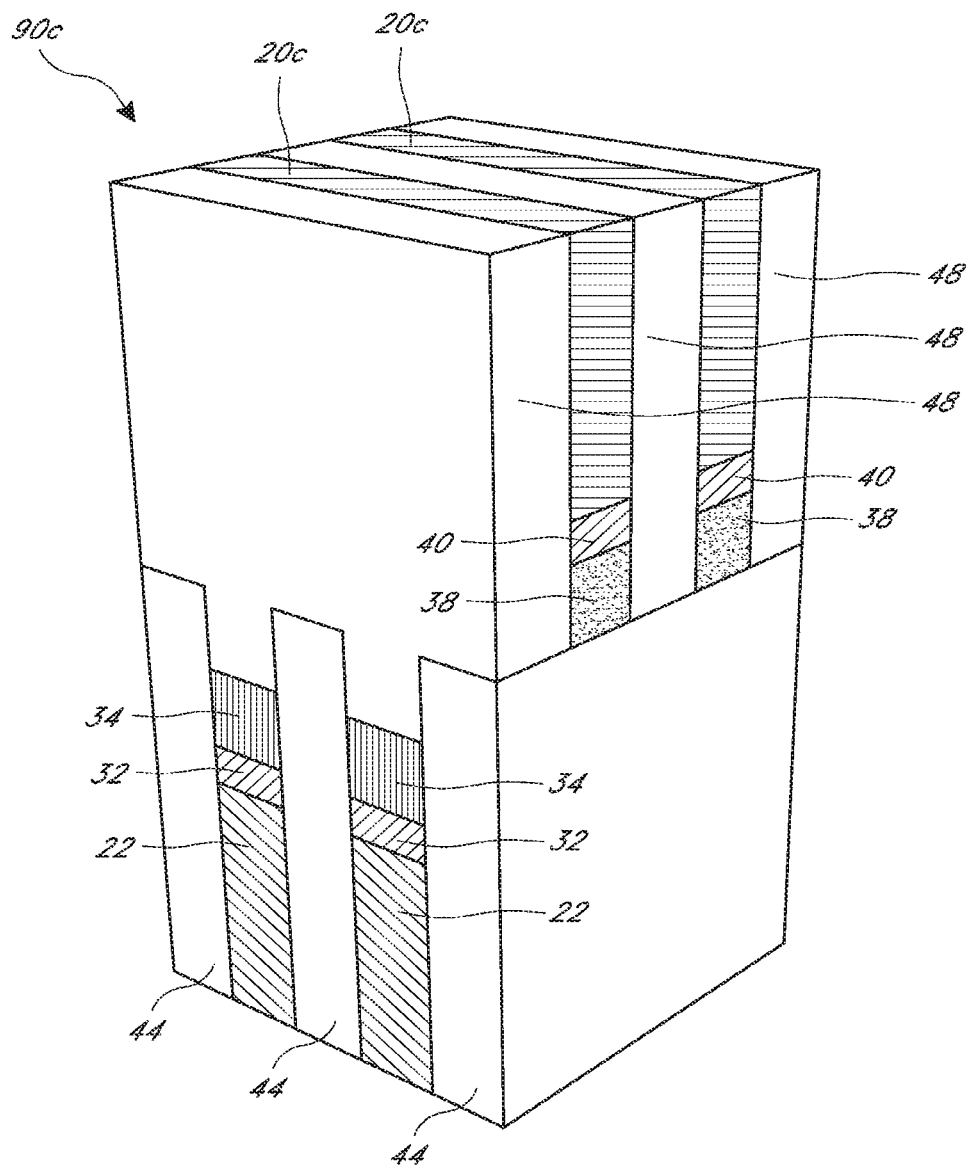

Referring to the array structure 90c of FIG. 6C, after the upper line stack is etched to form the array structure 90b, spaces between adjacent upper line stacks are filled and chemical-mechanically polished to remove excess isolation dielectric, leaving exposed alternating lines of sacrificial lines 20c and spaces comprising isolation dielectric regions 48, in a similar manner as described above in connection with FIG. 4C. The resulting sacrificial lines 20c are disposed on the upper electrode lines 38 and extend in the y-direction.

Figure 6D:
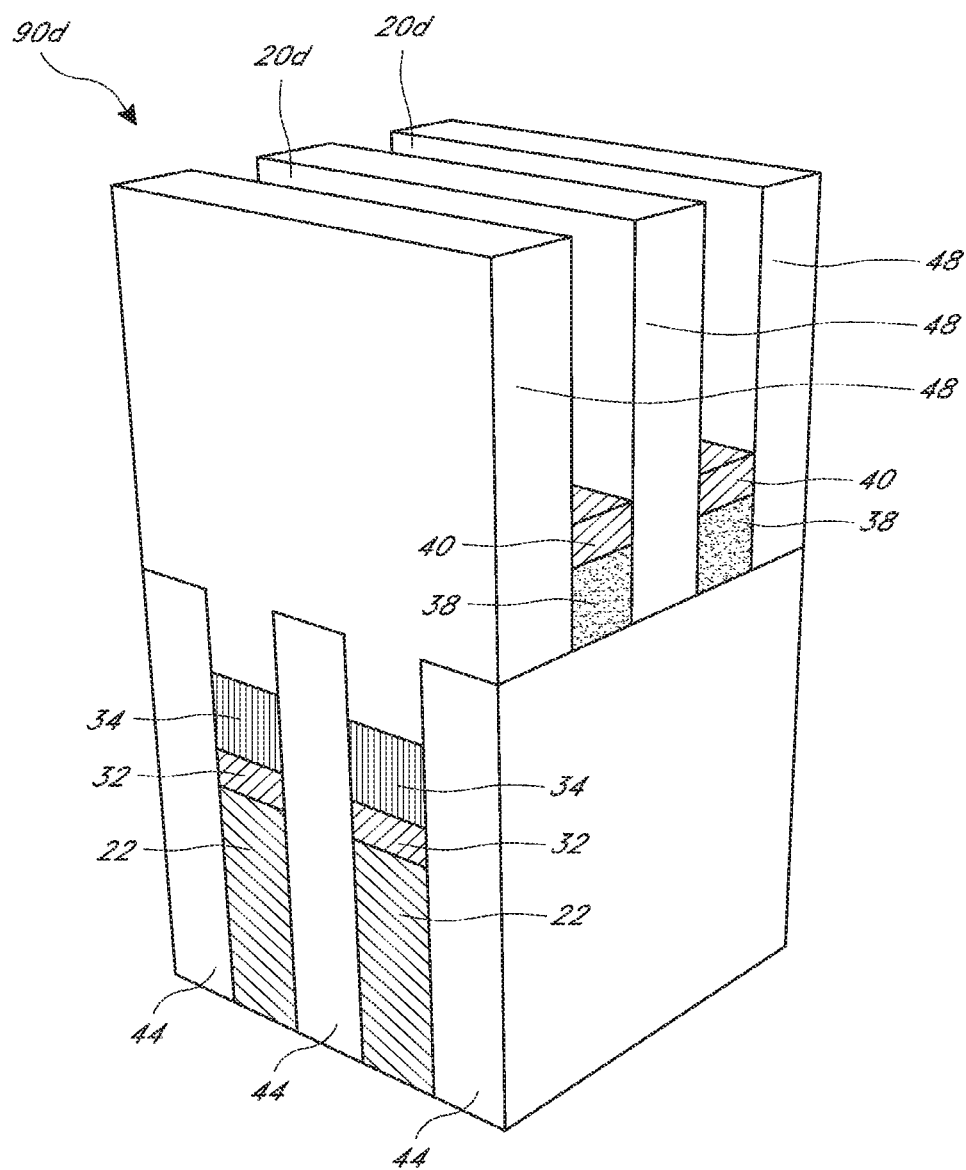
Figure 6E:
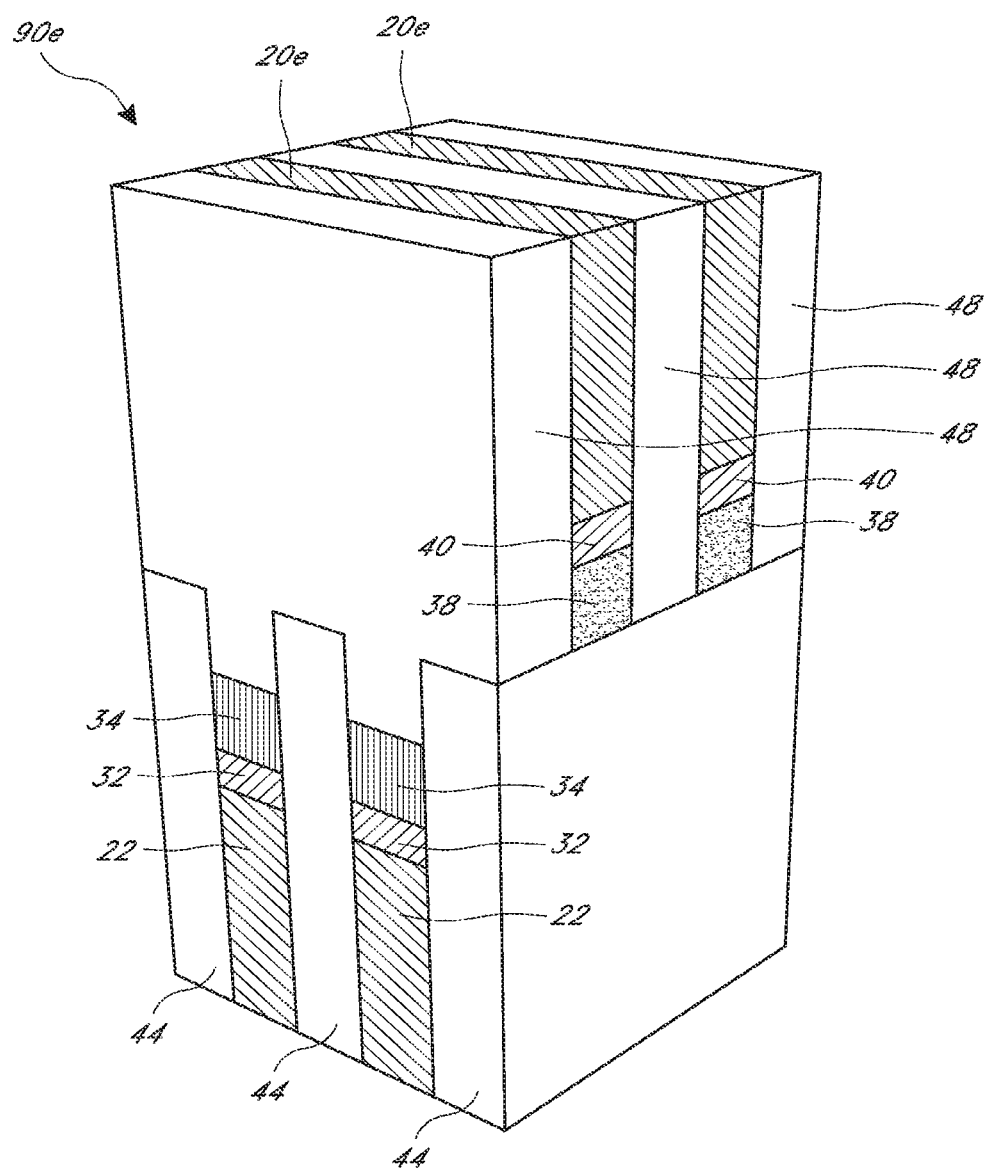

Referring to the array structures 90d and 90e of FIGS. 6D and 6E, the method of fabricating the memory array additionally comprises forming an upper conductive line extending in the y-direction by replacing the sacrificial material of the sacrificial line 20c (FIG. 6C) with an upper conductive material to form an upper conductive line 20e extending in the y-direction, in a manner similar to FIGS. 4D and 4E.

Referring to FIG. 6D, forming the upper conductive line 20e includes performing a self-aligned selective etching to remove the sacrificial material from the sacrificial line 20b, to create gaps 20d extending in the y-direction. Referring to FIG. 6E, the gaps 20d created by selectively removing the sacrificial lines 20c are filled with the upper conductive material. After filling the gaps 20d with the upper conductive material, the surface of the array structure 90e is planarized via a CMP process to removes excess upper conductive material, leaving exposed alternating lines of upper conductive lines 20e and spaces comprising isolation dielectric regions 48. The resulting upper conductive lines 20e are disposed on the upper electrode lines 40, which are in turn disposed on upper chalcogenide lines 38.

FIGS. 7A-7E show three-dimensional depictions illustrating a method of fabricating a memory array according to another embodiment. The method includes subtractively patterning a lower line stack extending in the x-direction. Subtractively patterning the lower line stack comprises providing a lower stack including a lower conductive material and a sacrificial material over the lower conductive material and etching the lower stack to form the lower line stack comprising a sacrificial line 34a over a lower conductive line 22. The method further includes forming a lower chalcogenide line extending in the x-direction by replacing the sacrificial material of the sacrificial line with a lower chalcogenide material. The method additionally incudes subtractively patterning an upper line stack extending in a y-direction different from the x-direction. Subtractively patterning the upper line stack comprises providing an upper stack including an upper conductive material over the lower line stack and etching the upper stack to form the upper line stack comprising an upper conductive line 20e.

Figure 7D:
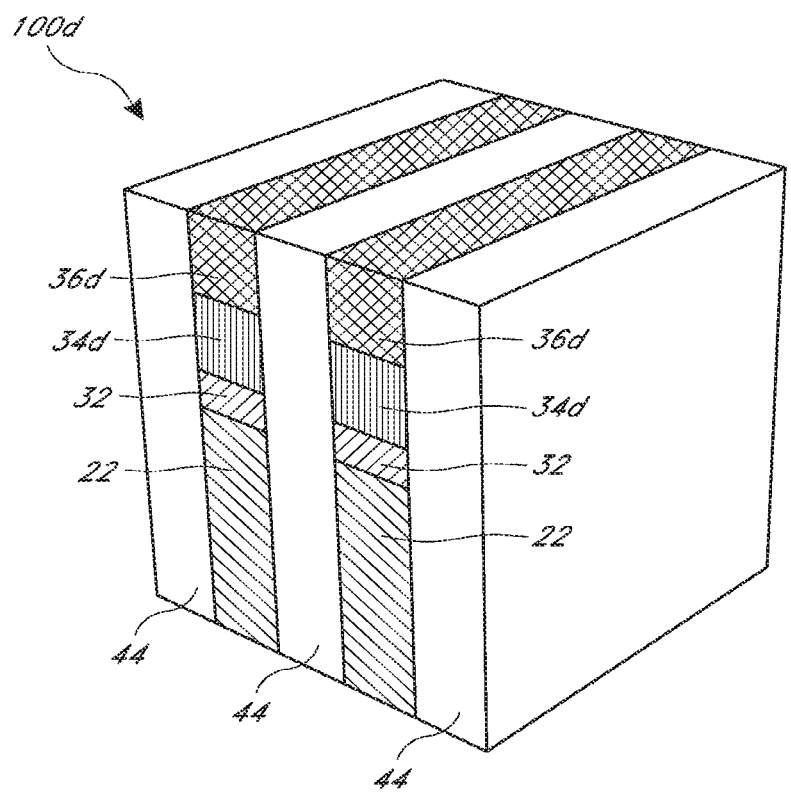

Referring to FIG. 7A-D, similar to FIGS. 3A-3D, subtractively patterning the lower line stack comprises providing a lower stack including a lower conductive material and a first sacrificial material over the lower conductive material, etching the lower stack to form the lower line stack comprising a first sacrificial line 34a over a lower conductive line 22, and forming an upper chalcogenide line extending in the first direction by replacing the first sacrificial material of the first sacrificial line 22 with an upper chalcogenide material 34c (FIG. 7C). The processes employed to arrive at the array structure 100d of FIG. 7D are similar to those employed to arrive at the array structure 60d of FIG. 3D, except in the following ways. Referring to FIG. 7A, providing the lower stack includes providing a lower conductive material over the substrate, a lower electrode material over the lower conductive material, and a sacrificial material over the lower electrode material. In addition, in FIG. 7A, etching the lower stack includes subtractively etching from the top, in the order of the sacrificial material 34a, the lower electrode material 32, and the lower conductive line material 22. The lower material stack is selectively etched to form the lower line stack extending in the x-direction, and comprises lower conductive lines 22, lower electrodes lines 32 on lower conductive lines 22, and sacrificial lines 34a on lower electrode lines 32. Once the row line stacks are formed, spaces between adjacent row line stacks are filled with a suitable isolation dielectric and chemical-mechanically polished to form isolation dielectric regions 44, as described in FIG. 3A. Referring to the array structure 100b of FIG. 7B, the sacrificial line 34a is removed to form gaps 34b, in a substantially similar manner as described in connection with FIG. 3B. Referring to FIG. 7C, similar to FIG. 3C, after the gaps 34b are created, the gaps 34b are filled with a chalcogenide material. Unlike FIG. 3C, however, the gaps are filled with a lower chalcogenide material. As discussed in connection with FIG. 1A-1C, whether an upper or a lower chalcogenide material serves as a storage node or a selector node, and whether the storage node and/or the selector node is confined in both x and y directions depends on the particular implementation of the technology. The array structure is subsequently planarized to form the resulting array structure 100c comprising lower chalcogenide lines 34c (in contrast to upper chalcogenide lines 38c in FIG. 3C) disposed on the lower electrode lines 32 and extending in the x-direction. The lower chalcogenide line 34c is electrically confined in the y-direction by adjacent isolation dielectric regions 44c.

In the array structure 100d of FIG. 7D, similar to FIG. 3D, subtractively patterning the lower line stack additionally includes forming a middle electrode line 36d (in contrast to the top electrode line 40d in FIG. 3D) extending in the x-direction by replacing at a portion of the lower chalcogenide material of the lower chalcogenide line 34c with a middle electrode material. Analogous to FIG. 3D, the resulting middle electrode line 36d is disposed on the lower chalcogenide line 34d.

Figure 7E:
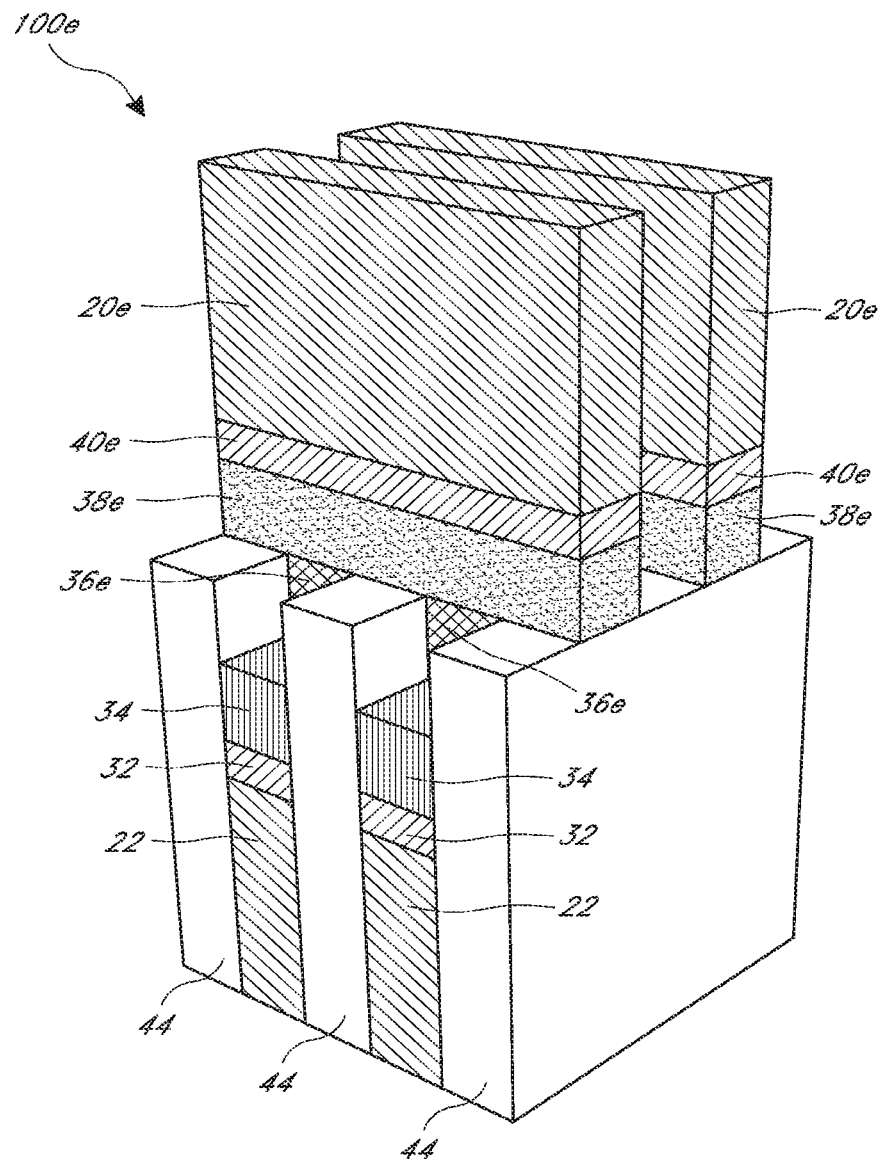

Referring to the array structure 100e of FIG. 7E, the method of fabricating the memory array further includes subtractively patterning an upper line stack extending in the y-direction. Subtractively patterning the upper line stack includes providing an upper stack including an upper chalcogenide material on the lower line stack, providing an upper electrode material on the upper chalcogenide material, and providing an upper conductive material on the upper electrode material. Subtractively patterning the upper line stack additionally includes etching the upper stack to form an upper line stack extending in the y-direction including an upper chalcogenide line 38e on the lower line stack, an upper electrode line 40e on the upper chalcogenide line 38e, and an upper conductive line 20e on the upper electrode line 40e. In addition, when middle electrode lines 36e are formed as illustrated in FIG. 7D, subtractively patterning the upper line stack additionally includes etching the middle electrode line 36e to form a two-dimensionally confined third electrodes 40e. The upper chalcogenide material is patterned into a chalcogenide line 38e.

FIGS. 8A-8E show three-dimensional depictions illustrating a method of fabricating a memory array according to some other embodiments. The method includes subtractively patterning a lower line stack extending in the x-direction. Subtractively patterning the lower line stack comprises providing a lower stack including a lower conductive material and a first sacrificial material over the lower conductive material and etching the lower stack to form the lower line stack comprising a first sacrificial line (not shown) over a lower conductive line 22. The method additionally includes forming a lower chalcogenide line 34 extending in the first direction by selectively removing the first sacrificial material of the first sacrificial line and replacing with a lower chalcogenide material. The method additionally includes subtractively patterning an upper line stack extending in the y-direction different from the x-direction, comprising providing an upper stack including a second sacrificial material over an upper chalcogenide material and etching the upper stack to form the upper line stack comprising a second sacrificial line 20b over an upper chalcogenide line 38. The method further includes forming an upper conductive line 20e extending in the y-direction by replacing the second sacrificial material of the second sacrificial line 20b with an upper conductive material.

Figure 8A:
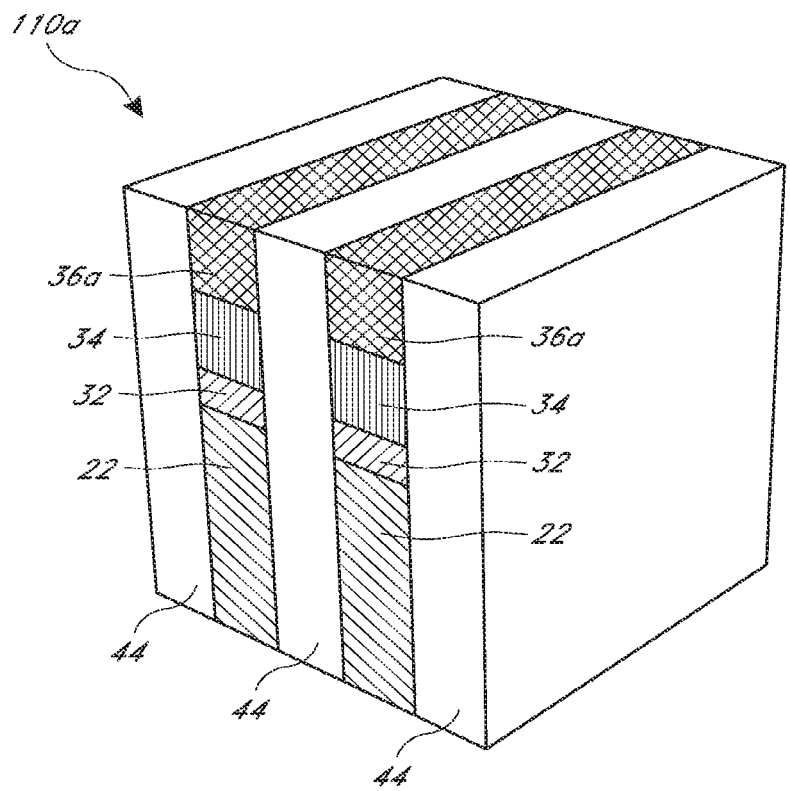
Figure 8C:
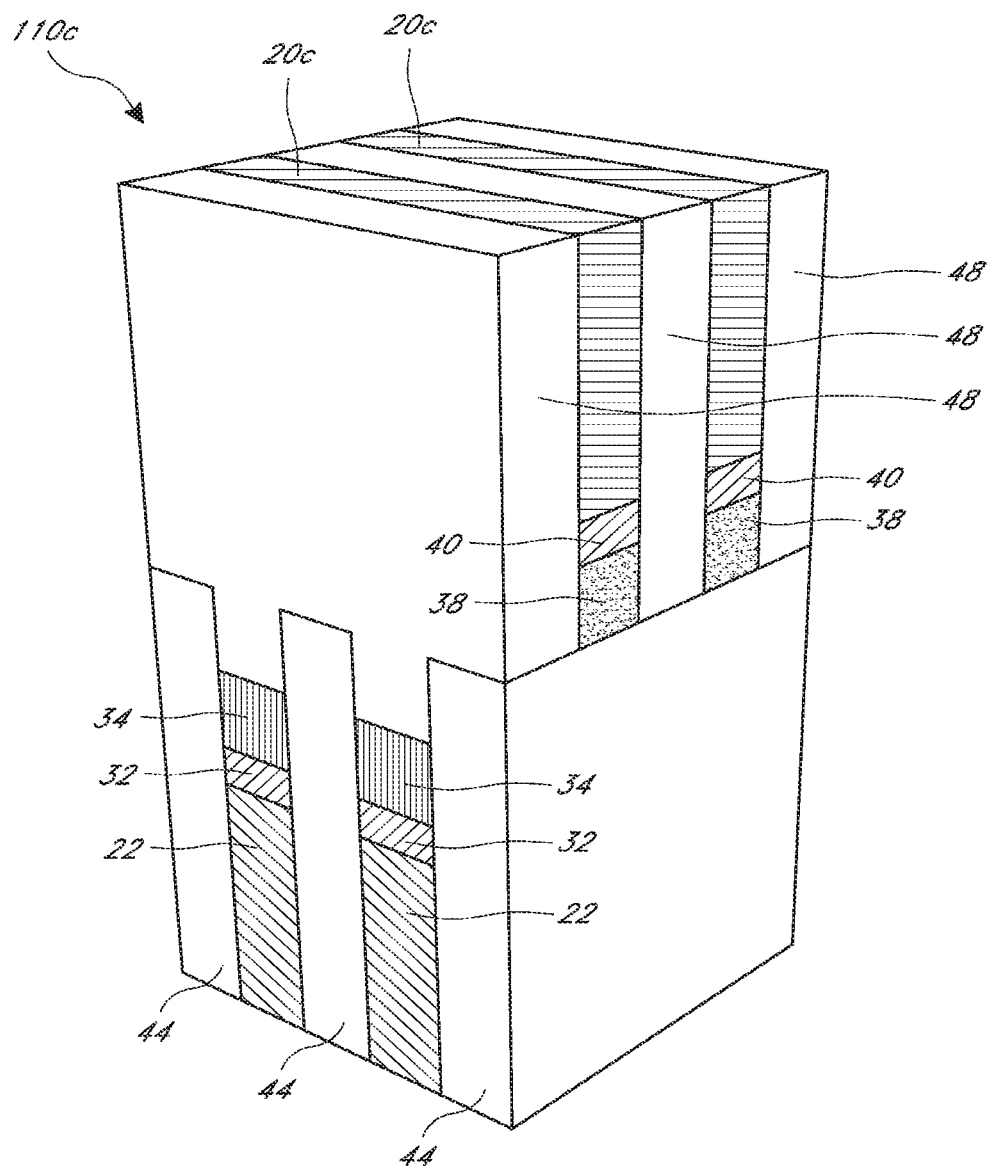
Figure 8D:
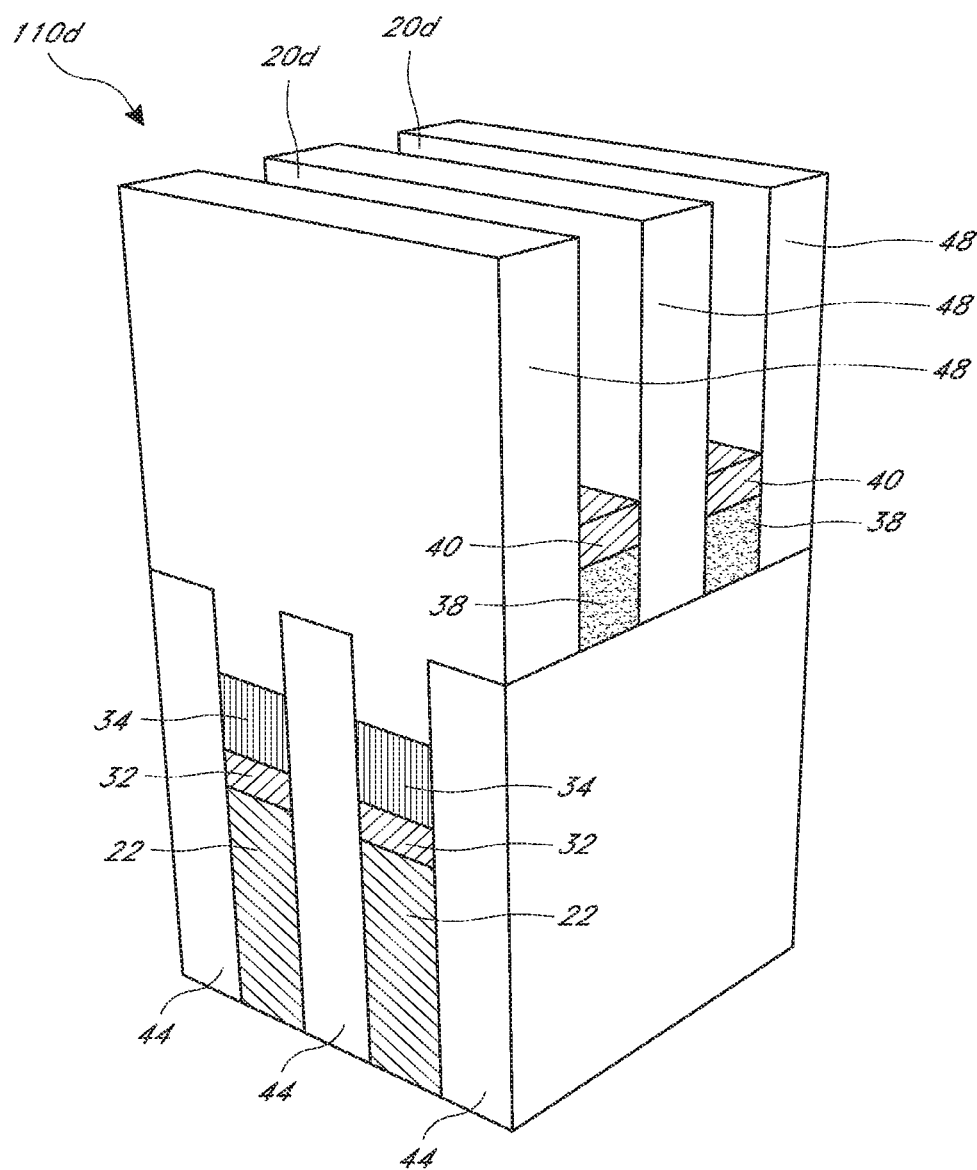
Figure 8E:
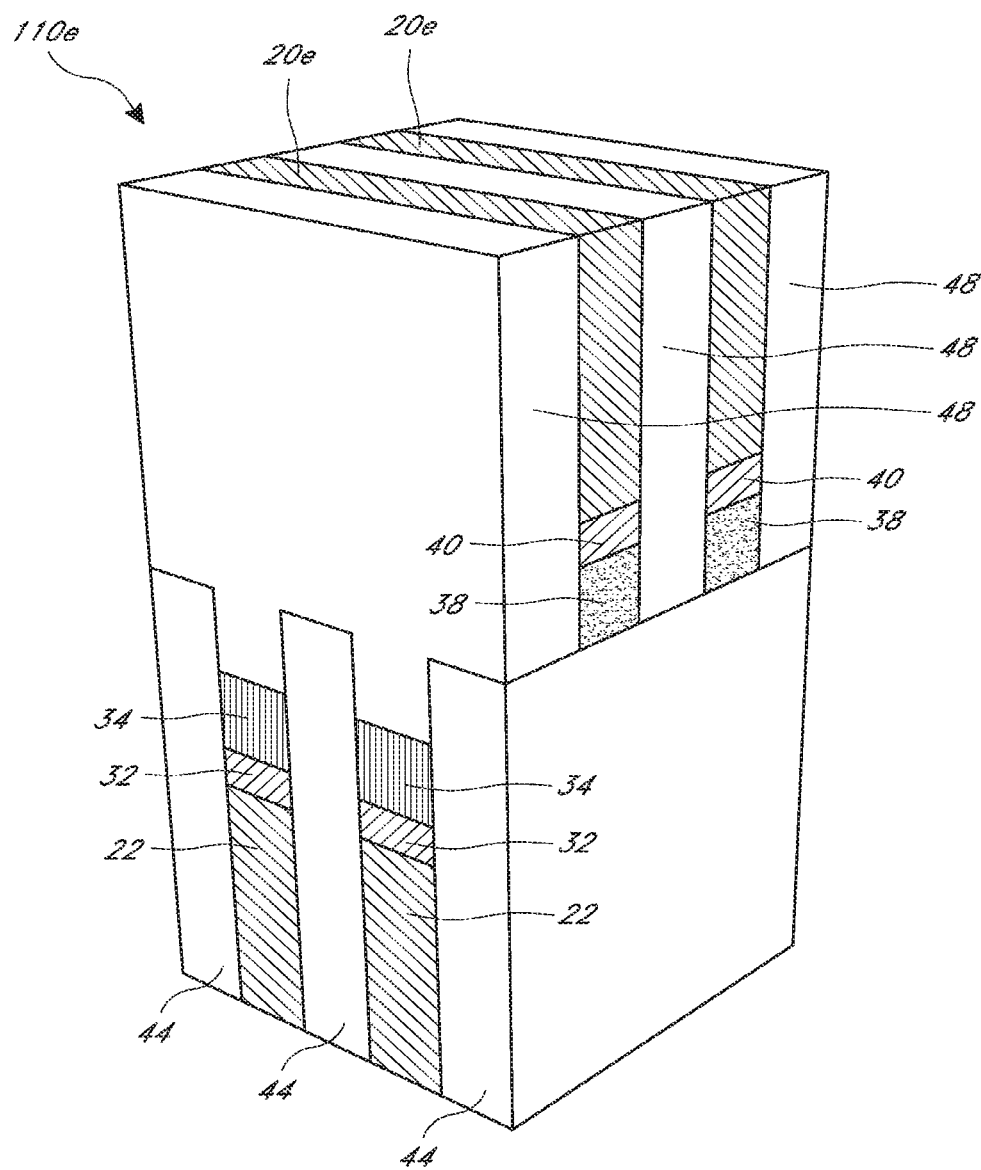

Referring to FIG. 8A, process steps involved in arriving at the array structure 110a are substantially similar to the method described in connection with arriving at the array structure 100d of 7D. Similar to FIG. 7D, the resulting array structure 110a comprises middle electrode lines 36a disposed on lower chalcogenide lines 34 formed by selectively removing and replacing the sacrificial line.

In addition, process steps involved in arriving at array structures 110b-110e of FIGS. 8B-8E are similar to and parallel the process steps involved in arriving at array structures 90b-90e of FIGS. 6B-6E. Similar to the array structure 90e of FIG. 6E, the resulting array structure 110e in FIG. 8E comprises upper conductive lines 20e disposed on the upper chalcogenide elements 38 (similar to 38c of FIG. 6C) or upper electrodes 40 (similar to 40c of FIG. 6C), and extend in the y-direction.

Thus, it will be understood that the concepts disclosed herein can take the form of various embodiments, some of which are discussed above and below.

In some embodiments, a method of forming a memory cell comprises: providing a lower line stack extending in a first direction, the lower line stack comprising a sacrificial line over a lower conductive line; and forming a chalcogenide line extending in the first direction by selectively removing sacrificial material of the sacrificial line and replacing the removed sacrificial material with a chalcogenide material. Providing the lower line stack can comprise subtractively patterning the lower line stack, wherein subtractively patterning the lower line stack comprises: providing a lower stack including a lower conductive material and the sacrificial material over the lower conductive material; and etching the lower sacrificial material and the lower conductive material to form the lower line stack. The method can further comprise: subtractively patterning an upper line stack over the lower line stack and extending in a second direction crossing the first direction, where subtractively patterning the upper line stack comprises: providing an upper stack comprising an upper conductive material over the lower line stack; and etching the upper conductive material to form the upper line stack comprising an upper conductive line. Subtractively patterning the upper line stack can further comprise etching the chalcogenide line to form a chalcogenide element electrically isolated in both first and second directions. Subtractively patterning the lower line stack can further include providing and etching a lower chalcogenide material between the lower conductive material and the sacrificial material to form a lower chalcogenide line over the lower conductive line. Subtractively patterning the lower line stack can further include providing and etching a lower electrode material between the lower conductive material and the lower chalcogenide material to form a lower electrode line on the lower conductive line.

In other embodiments, a method of forming a memory cell comprises: providing a lower line stack extending in a first direction, the lower line stack comprising a sacrificial line over a lower conductive line; and forming a chalcogenide line extending in the first direction by selectively removing sacrificial material of the sacrificial line and replacing the removed sacrificial material with a chalcogenide material. Providing the lower line stack can comprise subtractively patterning the lower line stack, wherein subtractively patterning the lower line stack comprises: providing a lower stack including a lower conductive material and the sacrificial material over the lower conductive material; and etching the lower sacrificial material and the lower conductive material to form the lower line stack. Subtractively patterning the upper line stack can further comprise providing and etching an upper chalcogenide material between the upper conductive line and the chalcogenide line to form an upper chalcogenide line extending in the second direction. Subtractively patterning the lower line stack can further comprise providing and etching a lower electrode layer between the lower conductive material and the sacrificial material to form a lower electrode line on the lower conductive line. Forming the chalcogenide line can further include selectively removing a portion of the chalcogenide material to form a second gap between two spaces filled with a dielectric, filling the second gap with a middle electrode material, and planarizing to form a surface comprising alternating middle electrode lines and chalcogenide lines. Subtractively patterning the upper line stack can further comprise etching the middle electrode line to form a middle electrode electrically isolated in both first and second directions.

In yet other embodiments, a method of forming a memory cell comprises providing a lower line stack extending in a first direction, the lower line stack comprising a chalcogenide line over a lower conductive line; providing an upper line stack over the lower line stack and extending in a second direction crossing the first direction, the upper line stack comprising a sacrificial line over the lower line stack; and forming an upper conductive line extending in the second direction by selectively removing sacrificial material of the sacrificial line and replacing the removed sacrificial material with an upper conductive material. Providing the lower line stack can comprise subtractively patterning the lower line stack, wherein subtractively patterning comprises: providing a lower stack including a lower conductive material and a chalcogenide material over the lower conductive material; and etching the lower conductive material and the chalcogenide material to form the lower line stack. Providing the upper line stack can comprise subtractively patterning the upper line stack, subtractively patterning comprising: providing an upper stack including the sacrificial material over the chalcogenide line; and etching the upper stack to form the upper line stack. Subtractively patterning the lower line stack can further include: providing and etching an upper chalcogenide material over the chalcogenide material; and etching to form an upper chalcogenide line over the chalcogenide line and extending in the first direction. Subtractively patterning the upper line stack can further include etching the upper chalcogenide line to form an upper chalcogenide element electrically isolated in both first and second directions. Subtractively patterning the upper line further can include providing the sacrificial material over an upper chalcogenide material and etching the sacrificial material to form the upper line stack comprising a sacrificial line over a second chalcogenide line.

In yet other embodiments, a method of forming a memory cell comprises: providing a lower line stack extending in a first direction, the lower line stack comprising a first sacrificial line over a lower conductive line; forming a chalcogenide line extending in the first direction by selectively removing first sacrificial material of the first sacrificial line and replacing the removed first sacrificial material with a chalcogenide material; providing an upper line stack extending in a second direction different from the first direction, the upper line stack comprising a second sacrificial line; and forming an upper conductive line extending in the second direction by selectively removing second sacrificial material of the second sacrificial line and replacing the removed second sacrificial material with an upper conductive material. Providing the lower line stack can comprise subtractively patterning the lower line stack, wherein subtractively patterning comprises: providing a lower stack including a lower conductive material and the first sacrificial material over the lower conductive material; and etching the lower conductive material and the first sacrificial material to form the lower line stack. Providing the upper line stack can comprise subtractively patterning the upper line stack, wherein subtractively patterning comprises: providing an upper stack including the second sacrificial material over the chalcogenide line; and etching the second sacrificial material to form the upper line stack.

In yet other embodiments, a method of forming a cross-point memory cell comprises: providing a lower line stack extending in a first direction, the lower line stack comprising a first sacrificial line over a first conductive line; forming a lower chalcogenide line extending in the first direction by selectively removing first sacrificial material of the first sacrificial line and replacing the removed first sacrificial material with a lower chalcogenide material; providing an upper line stack extending in a second direction different from the first direction, the upper line stack comprising a second sacrificial line over an upper chalcogenide line; and forming an upper conductive line extending in the second direction by selectively removing second sacrificial material of the second sacrificial line and replacing the removed second sacrificial material with an upper conductive material. Providing the lower line stack can comprise subtractively patterning the lower line stack, wherein subtractively patterning comprises: providing a lower stack including a first conductive material and a first sacrificial material over the lower conductive material; and etching the first conductive material and the first sacrificial material to form the lower line stack. Providing the upper line stack can comprise subtractively patterning the upper line stack, wherein subtractively patterning comprises: providing an upper stack including a second sacrificial material over an upper chalcogenide material; and etching the second sacrificial material to form the upper line stack. Forming the lower chalcogenide line can further include selectively removing a portion of the lower chalcogenide material to form a gap between two spaces adjacent to the first sacrificial line filled with a dielectric, filling the gap with a middle electrode material, and planarizing to form a surface comprising alternating middle electrode lines and chalcogenide lines. Subtractively patterning the upper line stack can further comprise etching the middle electrode line to form a middle electrode electrically isolated in both first and second directions.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:
1. A method, comprising:
   forming a first line stack oriented in a first direction, the first line stack including a first chalcogenide line over a first conductive line, wherein the first chalcogenide line is a memory element or a selector element of a memory cell; and forming a second line stack oriented in a second direction different from the first direction, the second line stack positioned above the first line stack and including a sacrificial line.

2. The method of claim 1, further comprising:
forming a conductive line oriented in the second direction, wherein forming the conductive line comprises:
removing sacrificial material of the sacrificial line, and replacing the removed sacrificial material.

3. The method of claim 1, wherein a second chalcogenide line is positioned below the sacrificial line of the second line stack.

4. The method of claim 1, wherein forming the second line stack comprises:
forming a stack of material that includes a sacrificial material; and
subtractively patterning the stack of material.

5. The method of claim 4, wherein the stack of material comprises:
a chalcogenide material positioned below the sacrificial material.

6. The method of claim 4, wherein the stack of material comprises:
an electrode material positioned below the sacrificial material.

7. The method of claim 4, further comprising:
depositing a dielectric material between a plurality of separated lines that extend in the second direction, wherein the depositing is based at least in part on the patterning of the stack of material.

8. The method of claim 7, further comprising:
removing the sacrificial line;
depositing a conductive material; and
forming a surface having conductive lines and dielectric areas.

9. The method of claim 4, wherein subtractively patterning the stack of material comprises:
etching a middle electrode line of the first line stack to form a middle electrode that is electrically isolated in both the first direction and the second direction.

10. The method of claim 1, wherein forming the first line stack or the second line stack comprises:
subtractively patterning using a pitch-multiplication process.

11. The method of claim 1, wherein the sacrificial line comprises at least one of carbon, polyimide, silicon oxide, aluminum nitride, or silicon.

12. A method, comprising:
forming a first line stack oriented in a first direction, the first line stack including a first chalcogenide line over a first conductive line; and
forming a second line stack oriented in a second direction different from the first direction, the second line stack positioned above the first line stack and including a sacrificial line, wherein forming the first line stack comprises:
forming a stack of material including a chalcogenide material and a conductive material; and
subtractively patterning the stack of material using etching.

13. A method, comprising:
forming a first line stack oriented in a first direction, wherein the first line stack includes a sacrificial line over a first conductive line;
forming a chalcogenide line extending in the first direction by removing the sacrificial line and replacing material of the sacrificial line;
forming a second line stack overlaying the first line stack and oriented in a second direction different than the first direction; and
replacing a sacrificial material with a stack of materials that includes a first chalcogenide material and a conductive material.

14. The method of claim 13, wherein forming the second line stack comprises:
forming a stack of material that includes a plurality of layers; and
subtractively patterning the stack of material using etching.

15. The method of claim 14, wherein at least one layer of the plurality of layers includes a second chalcogenide material, a first conductive material, or a second conductive material.

16. The method of claim 13, wherein forming the first line stack comprises:
forming a stack of material that includes the conductive material and the sacrificial material;
etching the stack of material to form the first line stack, wherein the first line stack includes a plurality of lines each isolated from one another by a gap;
filling each gap with a dielectric material; and
planarizing the stack of material to form a surface that includes chalcogenide lines and dielectric areas.

17. The method of claim 13, wherein the first conductive line comprises at least one of tungsten, aluminum, copper, doped silicon, titanium nitride, or tantalum nitride.

18. A method, comprising:
forming a first line stack oriented in a first direction and including a first chalcogenide line over a first conductive line;
forming a sacrificial line oriented in a second direction different from the first direction and positioned above the first line stack, wherein a second chalcogenide line is positioned below the sacrificial line; and
forming a second conductive line oriented in the second direction by replacing the sacrificial line.

* * * * *